United States Patent [19]

Linger et al.

[11] Patent Number: 4,481,664
[45] Date of Patent: Nov. 6, 1984

[54] PROCESS FOR INSPECTING OBJECTS SHOWING PATTERNS WITH DIMENSIONAL TOLERANCES AND REJECT CRITERIA VARYING WITH THE LOCATIONS OF SAID PATTERNS AND APPARATUS AND CIRCUITS FOR CARRYING OUT SAID PROCESS

[75] Inventors: Claude J. A. Linger, Paris; Giséle C. Locicero, Evry, both of France

[73] Assignee: International Business Machines Corporation, Armonk, N.Y.

[21] Appl. No.: 329,892

[22] Filed: Dec. 11, 1981

[30] Foreign Application Priority Data

Dec. 18, 1980 [FR] France .................. 80 430030

[51] Int. Cl.³ .......................................... G06K 9/00
[52] U.S. Cl. ................................ 382/8; 356/394; 358/106; 358/107; 364/489
[58] Field of Search ................ 209/576, 586; 250/560, 250/563; 356/394, 398; 358/101, 106, 107; 364/489–491; 382/8

[56] References Cited

U.S. PATENT DOCUMENTS

| | | | |
|---|---|---|---|
| 3,546,377 | 12/1970 | Troll | 356/398 X |
| 3,645,626 | 2/1972 | Druschel | 356/394 X |
| 3,868,508 | 2/1975 | Lloyd | 358/106 X |
| 3,887,762 | 6/1975 | Uno et al. | 358/106 |
| 3,909,602 | 9/1975 | Micka | 364/490 |
| 3,955,072 | 5/1976 | Johannsmeier et al. | 364/490 X |
| 3,963,866 | 6/1976 | Tanie | 358/107 X |
| 3,987,244 | 10/1976 | Messman | 358/106 |
| 4,056,716 | 11/1977 | Baxter et al. | 358/106 X |
| 4,185,298 | 1/1980 | Billet et al. | 358/106 |
| 4,269,515 | 5/1981 | Altman | 356/394 |
| 4,277,175 | 7/1981 | Karasaki et al. | 356/394 X |
| 4,305,097 | 12/1981 | Doemans et al. | 364/491 X |

Primary Examiner—Robert B. Reeves
Assistant Examiner—Edward M. Wacyra
Attorney, Agent, or Firm—John J. Goodwin

[57] ABSTRACT

First of all, this invention relates to a process based on the comparison of the image of a reference object $I_{ref}$ with the image of an object to be inspected $I_{exa}$. Images $I_{ref}$ and $I_{exa}$ are picked-up, sampled, discretized and threshold to produce electronic or binary images $I_{REF}$ and $I_{EXA}$, respectively. These images are cleaned, then centered, $I_{REF}$ is adjusted to the minimum dimensional tolerances and becomes $(I_{REF})_{min}$. For each image point (pixel), the adjustment is performed by using a structuring element of variable size, the size of which is controlled by a bus from the data contained in a memory unit which take the location of the pixel on the reference object, into account. $(I_{REF})_{min}$ is compared to $I_{EXA}$ which ensures the following function:

$$[(I_{REF})_{min} \text{OR } I_{EXA}] \text{EXCL. OR } I_{EXA}.$$

The resulting image is the image of the "lack" type defects (which does not appear in $I_{exa}$ with respect to $I_{ref}$). Each defect is studied in a defect analysis unit which computes the dimensions of the defect and compares these dimensions with the maximum allowed size of the defect in this location. For this purpose, this circuit uses the reject criteria for this location, which are contained in a memory unit. The processing operations (adjustment and analysis) and the production of the corresponding data contained in the memory, are synchronized by count and delay circuits. The binary result (accepted/rejected) is available on a line. The defects of the "spreading" type are processed in the same way. The logic level of the line which is connected to a computer, determines the final decision (accepted/rejected). This invention also relates to an apparatus and circuits for carrying out the described process. This invention can be more particularly used in manufacturing semiconductors (masks, modules, chips, ...).

25 Claims, 31 Drawing Figures

FIG. 5
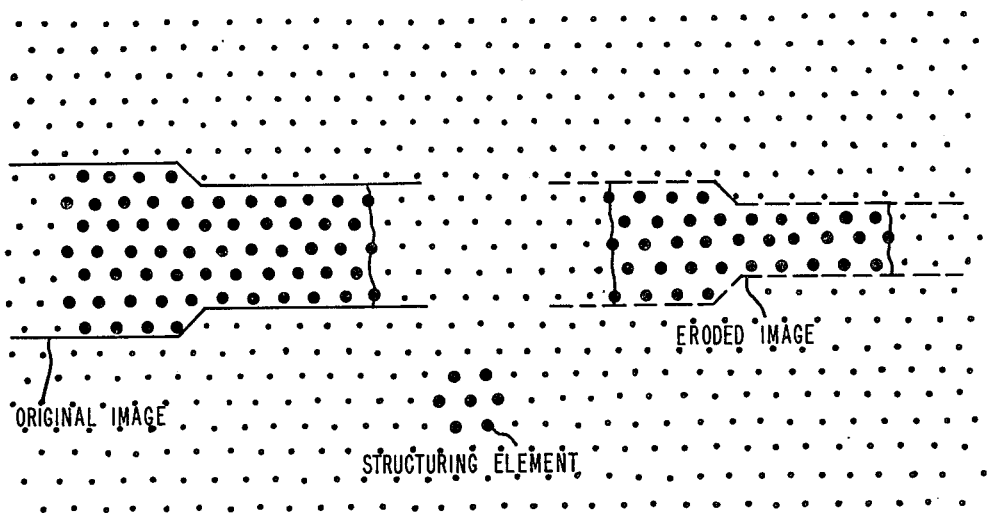
ORIGINAL IMAGE
ERODED IMAGE
STRUCTURING ELEMENT
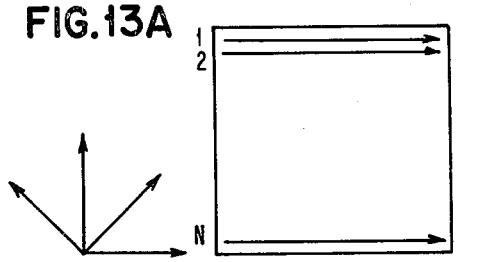
HORIZONTAL THROUGH-LENGTHS
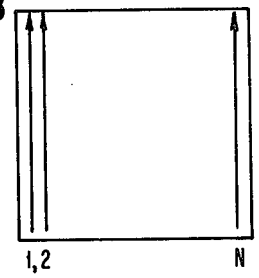
VERTICAL THROUGH-LENGTHS
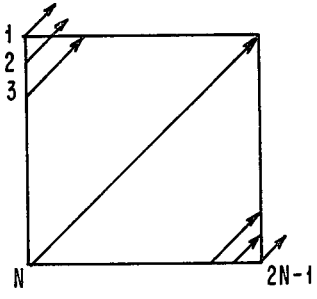
DIAGONAL AT 45°
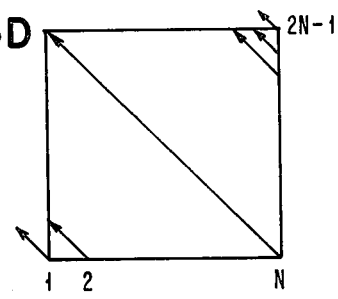
DIAGONAL AT 135°

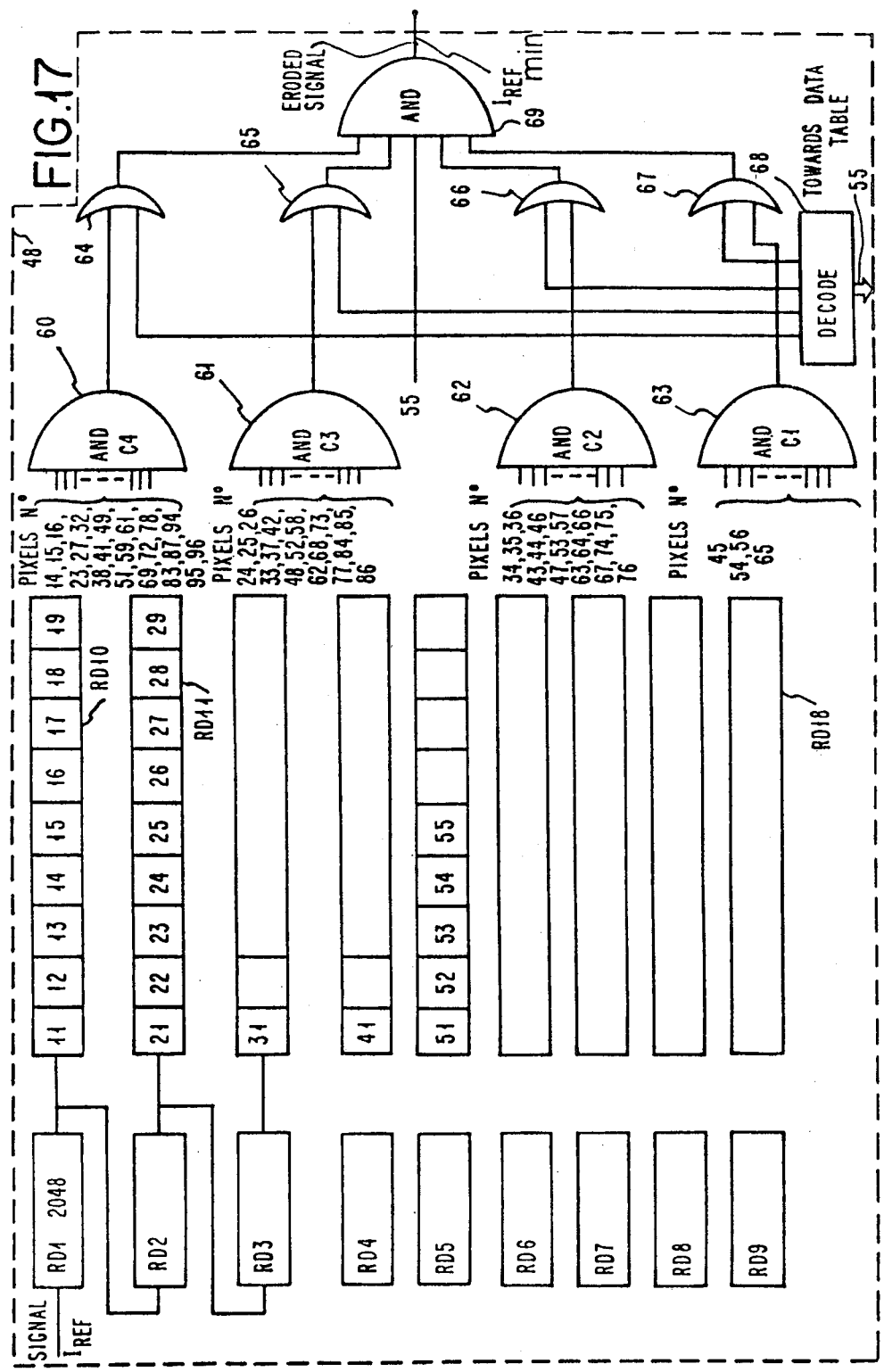

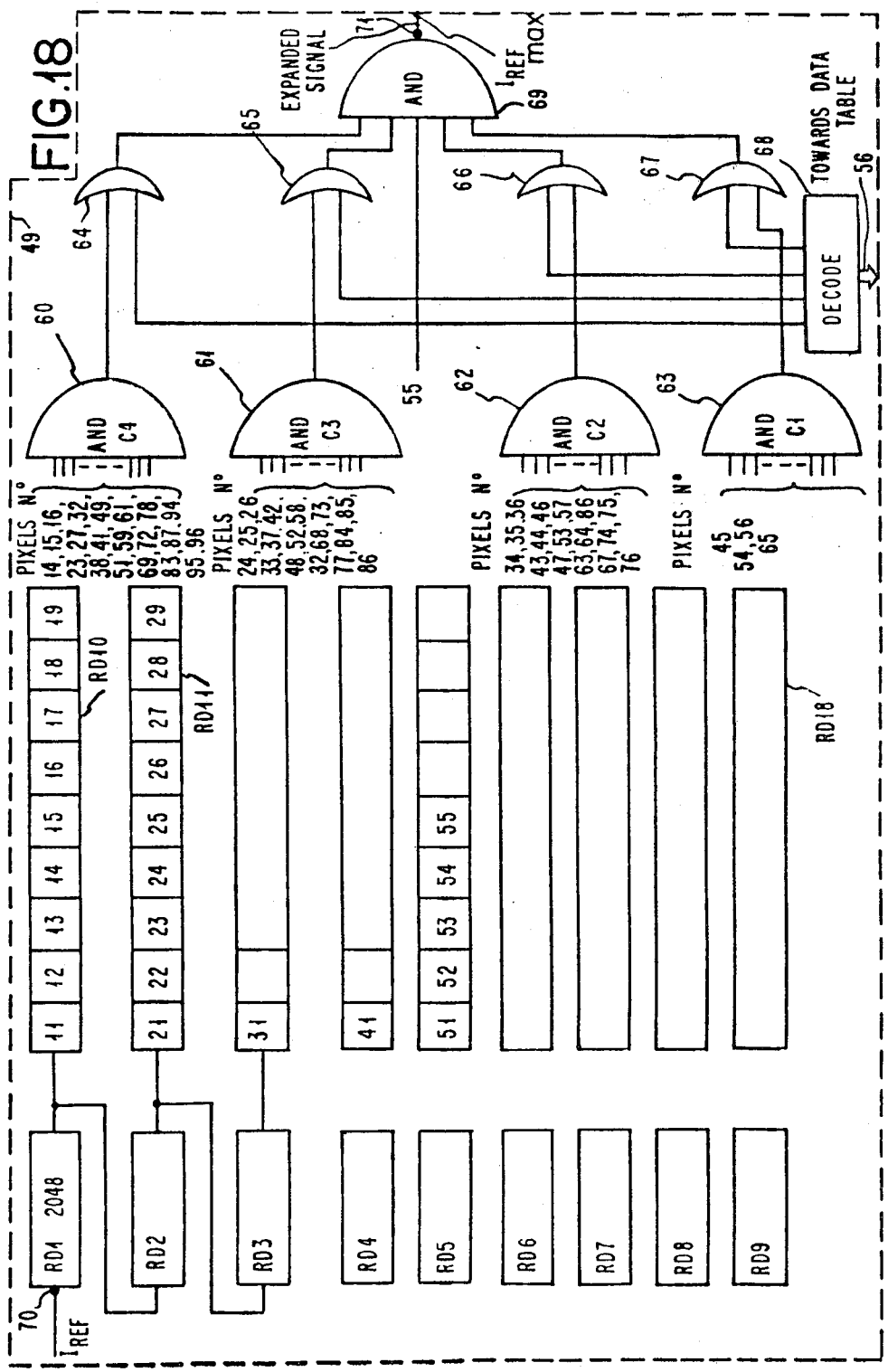

| TABLE N°1 | | | | |
|---|---|---|---|---|
| N = 25μ | θ = 0° | 75μ L min -A | 25μ X% L min | 175μ K.L min |

PROCESS FOR INSPECTING OBJECTS SHOWING PATTERNS WITH DIMENSIONAL TOLERANCES AND REJECT CRITERIA VARYING WITH THE LOCATIONS OF SAID PATTERNS AND APPARATUS AND CIRCUITS FOR CARRYING OUT SAID PROCESS

CROSS-REFERENCE TO RELATED APPLICATION

This application contains subject matter common to Ser. No. 330,411 filed Dec. 14, 1981 by the Applicants herein.

DESCRIPTION

1. Technical Field

This invention relates on the one hand, to a process for contactless inspection and automatic sorting of objects having dimensional tolerances and reject criteria varying with their locations and, on the other hand, to the apparatus and circuits for carrying out said process. It relates more particularly to a process for contactless inspection and automatic sorting of objects presenting patterns having dimensional tolerances and reject criteria varying with their locations like printed circuit cards, masks, modules and integrated circuit chips used in the semiconductor domain. Said process uses the basic transformations of the mathematical morphology and of the set theory. Said invention also relates to the apparatus and circuits associated to a digital computer and provided to carry out the process of this invention.

2. Background Art

Various processes based on the comparison between a reference object meeting the appropriate requirements and a similar object to be inspected in order to check that it meets said requirements, are known in the art. In particular, the reader can be referred to the following documents: French Pat. No. FR-A-74 36307 assigned to the Westinghouse Corporation and published under U.S. Pat. No. 2,249,520, describes a process consisting in scanning the reference object with an infrared radiation detector, comparing the signals generated by the reference object and by the object under inspection to detect any difference between said signals and in statistically analysing any difference to determine whether the object under inspection can be operated within the required limitations or not.

The above indicated patent describes a good example of the compare technique using a determined electrical parameter (in this case, the current flow), to compare a reference object and a similar object to be inspected. In order to compare drawing patterns by using the same principle, French Pat. No. FR-A-71 15069 assigned to the IBM Corporation and published under U.S. Pat. No. 2,095,523, describes an apparatus for detecting defects by optical scanning. This apparatus is mainly used for fabricating photomasks. Said apparatus which can be used to inspect objects with tolerances varying with their location can operate only if the object to be inspected shows repeated patterns. In addition, the reference object is a special object which does not belong to the family of the objects to be inspected and, therefore, which is specially built to take certain characteristics of the object to be inspected, into account.

As to sorting objects showing patterns with variable dimensional tolerances, the technique applied today consists in employing operators using binoculars for manually and optically sorting said objects. This operation is long, uninteresting and costly. In practice, only few samples randomly taken on the fabrication line, are sorted. Therefore, the quality and reliability of all said objects can not be granted to the customers.

SUMMARY OF THE INVENTION

A first object of this invention is to provide a process and an apparatus for automatizing inspection and sorting of objects showing patterns having variable dimensional tolerances and reject criteria in order to avoid manual optical sorting.

Another object of this invention is to provide a process and an apparatus for inspecting and sorting objects showing patterns with tolerances and reject criteria varying with the location of said patterns.

Another object of this invention is to provide a process and an apparatus for detecting the defects of an object to be inspected from a reference object of the same family.

Another object of this invention is to provide a process and an apparatus for inspecting and sorting objects showing patterns having tolerances and reject criteria varying with the location of said patterns, and determining whether the object to be inspected can be operated within required limits or not, in accordance with previously determined reject criteria.

Another object of this invention is to provide a process and an apparatus for inspecting and sorting objects showing patterns having tolerances and reject criteria varying with the location of said patterns, said reject criteria being automatically elaborated from a reference object by carrying out a preliminary step of said process.

Yet another object of this invention is to provide a process and an apparatus for inspecting and sorting objects showing patterns with tolerances and reject criteria varying with the location of said patterns, in which the required capacity of the memory ensuring the adjustment in function of the variable tolerances and the analysis according to the variable reject criteria, is very small as compared with the number of bits representing the image (for instance 20 memory lines of 2048 bits for an image which can comprise 2048 lines (or more) of 2048 bits).

First of all, this invention relates to a process for inspecting and automatically sorting objects showing patterns with dimensional tolerances and reject criteria varying with the location of said patterns. In this application, to simplify the description, only the embodiment relating to the the sorting of ceramic modules (of the type of the one shown on FIG. 1A) will be described in details. The application of the process of this invention to other objects with variable tolerances and in current use in the semiconductor industry such as masks, reticles, printed circuit cards, integrated circuit chips, etc. . . ., lays within the skill of the man of the art. This invention relates more particularly to the geometrical patterns of the objects but is not limited to this type of application.

An electronic module 10 a portion of which is shown on FIG. 1A, is a good example of this type of object. In effect, metal conductors 11 deposited on the ceramic substrate, have different widths and directions. In practice, the conductors can have three different widths, i.e. 250, 125 and 100$\mu$ and be orientated in four directions, i.e. 0°, 45°, 90° and 135°. Metallized pads 12 surrounding pins 13 are octagonal or approximately octagonal. In general, the conductors connect a pad 12 to a chip contact pad 14 receiving a solder ball from the chip (not shown). The inspection instructions specify the minium dimensions of the conductors expressed as a certain percentage of their nominal width. In general, said percentage is the same for all the conductors. As to the maximum dimensions, they depend on the conductor inter-space allowed on the substrate. Therefore, it is obvious that with this type of module, the minimum and maximum dimensional tolerances (in absolute value) depend on the conductor pattern in the area under inspection. Since a step for adjusting the reference image with respect to the dimensional tolerances, is provided in this invention, it is obvious that this adjustment will have to take the area under inspection, into account.

Further, a same defect can be acceptable or not depending upon its location. For instance, a defect of the "lack" type has no importance in a conductor with a width of 250μ while a module with the same defect should be rejected when the conductor has a width of 100μ (see FIG. 1B). Then, it is to be understood that the reject criterion should also take the area under inspection, into account. Each time a defect is detected, it is necessary to associate the reject criterion or criteria established for this area, to said defect.

These two points are essential to the understanding of the process of this invention the principle of which is schematically shown on FIG. 2.

The images of reference module ($I_{ref}$) and of sample module ($I_{exa}$) are picked up, sampled and quantized, then threshold, cleaned and centered to provide binary or electronic images $I_{REF}$ and $I_{EXA}$, respectively. The image of the reference module $I_{REF}$ is adjusted to the maximum and minimum dimensional tolerances by two different ways to obtain $(I_{REF})_{max}$ and $(I_{REF})_{min}$. These images are compared to the image of sample module $I_{EXA}$ to provide an image of the defects of the "lack" type and an image of the defects of the "spreading" or "extension" type. The object images are closely examined through an analysis window to determine whether they can be accepted or not.

This invention is characterized by the provision of a timing and addressing circuit associated to a memory which, for each point M of coordinates X, Y under analysis, ensures a dual function. First, it determines the value of the dimensional tolerance for this point and acts on the block ensuring the adjustment to said dimensional tolerances. In other words the adjustment of $I_{REF}$ to the dimensional tolerances carried out prior to the compare operation, varies with the location of said point. In addition, after the compare operation, said circuit acts on the defect image while taking the delays into account. It determines the reject criteria (which, in practice, consist in the maximum size allowed to the defect) for this point and provides said reject criteria to a defect analysis block which is mainly comprised of compute and compare circuits. These circuits compute the projections of the defect in two directions: in direction θ of the conductor containing this point of the defect and in its perpendicular direction. Then, said circuits compare these projections with the reject criteria and finally determine whether the defect has an acceptable size or not. Prior to this step, the memory has been manually or automatically loaded with the various data relating to the dimensional tolerances and the reject criteria for each point to be analysed. When these data are established for each point of $I_{REF}$, they can require too much room in the memory. Consequently, in this invention, the various operations are carried out region by region. On defines a virtual image $I_{VIRT}$ corresponding to $I_{REF}$ divided in squares and for all point M of a square, the data will be identical. The result of the defect analysis indicates whether the sample module under inspection is to be accepted or rejected.

This invention also relates to an apparatus and circuits for carrying out said process.

Specific features of the invention as well as specific objects and advantages thereof, will become readily apparent from the following detailed description taken in conjunction with the accompanying drawings in which:

BRIEF DESCRIPTION OF THE DRAWINGS

FIG. 5 shows the development of an image sampled in accordance with an hexagonal frame after a morphological transformation of the erosion type.

FIG. 13 illustrates the scanning movement on the module image in four directions for automatically generating data tables controlling the adjustment of the object to its dimensional tolerances and the reject criteria.

FIG. 17 is a detailed illustration of the minimum dimensional tolerance (erosion) adjust block of FIG. 15.

FIG. 18 is a detailed illustation of the maximum dimension tolerance (expansion) adjust block of FIG. 15.

DISCLOSURE OF THE INVENTION

Figure 1A:
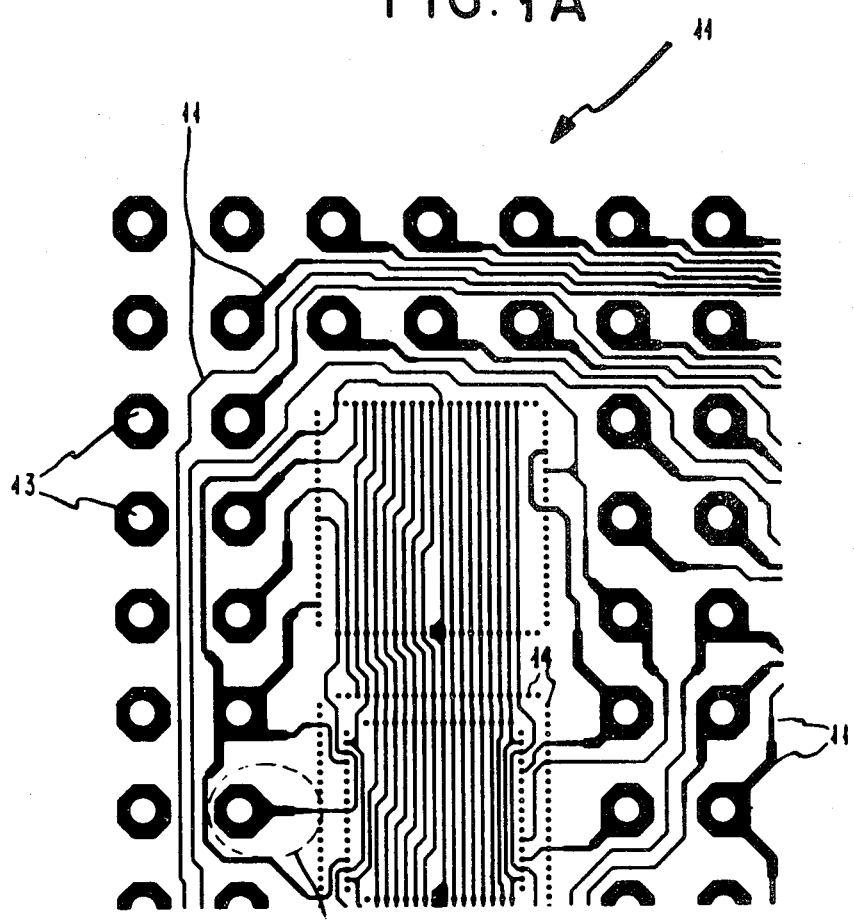
FIG. 1A shows a portion of a particular electonic module which is provided with conductor patterns with tolerances varying in accordance with the location of said patterns.
Figure 1B:
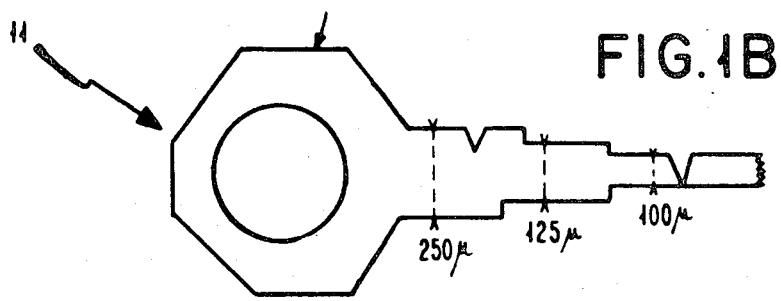
FIG. 1B is an enlarged view of a conductor.
Figure 2:
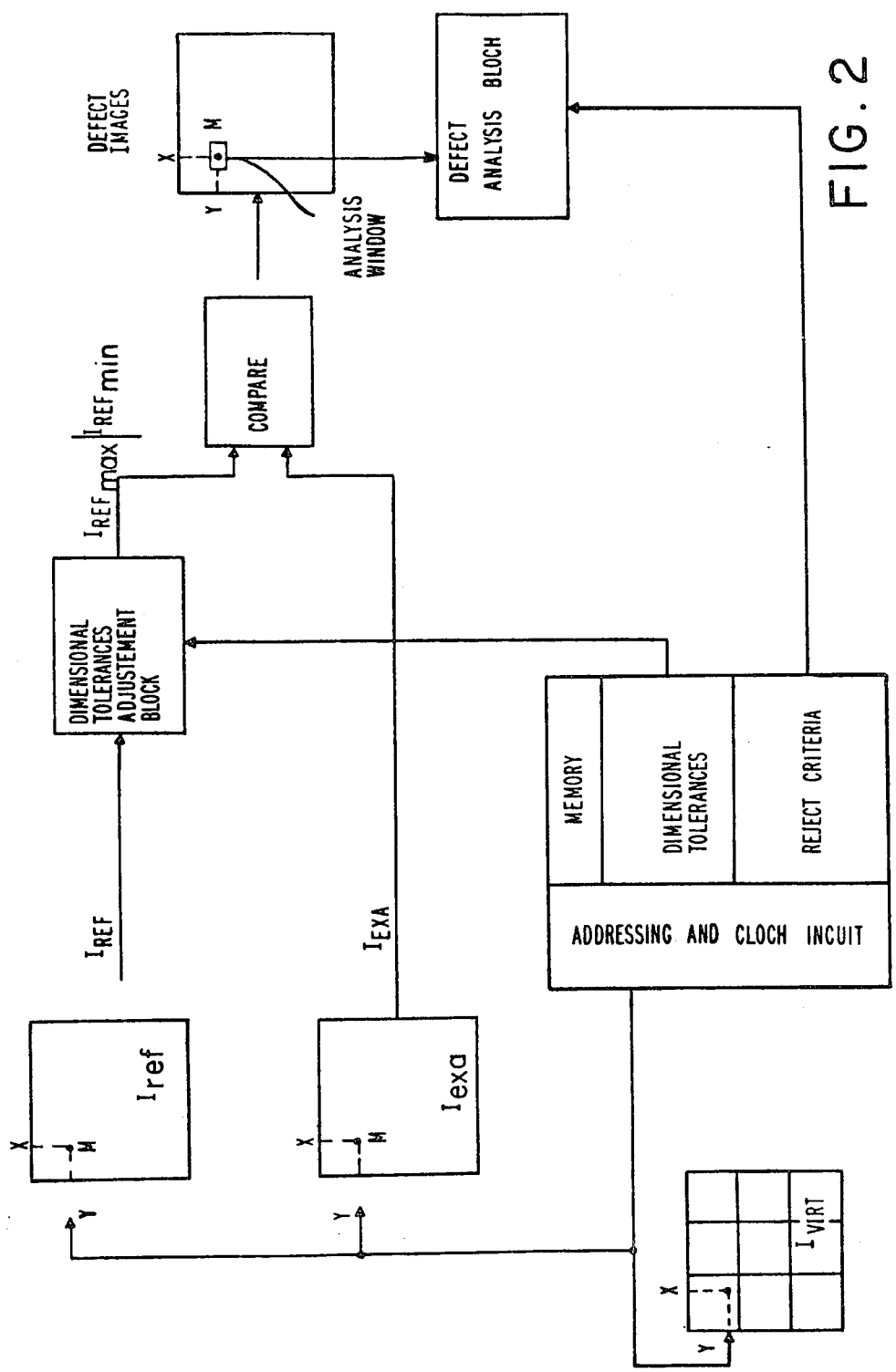
FIG. 2 is a functional diagram showing the main features of this invention.

The process of this invention applies well known Boolean operation as the union, intersection and inversion operations, to process electronic images and to show the defects. However, other operations must be performed to clean or modify the images while taking the minimum and maximum dimensional tolerances of these circuits into account. These operations are related to the mathematic morphology and mainly consist in the erosion and expansion operations which are briefly recalled in the following.

I. MATHEMATICAL MORPHOLOGY ELEMENTS

The definitions of the various basic transformations used in digitally processing the image in accordance with the teachings of this invention are mainly based upon the principle of the structuring element and of the transformations of the "full or nil" type: i.e. erosion and expansion. The space to which the operations are applied is euclidian space R2 provided with its metric d. 0 defines the origin of the space under consideration. If B defines any set of this space, $B_x$ defines the translate of B by vector Ox. Then it is possible to define:

(a) expansion

A and B are two sets of R2. A new set A $\oplus$ B is said "A expanded by B" and is such that:

$$A \oplus B = \{x \in R2 | B_x \cap A \neq \phi\}$$

In other words, a point x of space R2 belongs to set A$\oplus$B if and only if the translate of B by OUS/0/ x encounters A. Set B is called a structuring element.

(b) erosion

A and B are two sets of R2. Set A $\oplus$ B is said "A eroded by B" and is such that:

$$A \ominus B = \{x \in R2 | B_x \subset A\}$$

A point x of space R2 belongs to set A$\ominus$B if and only if set $B_x$ is entirely included in A.

(c) expansion and circular erosion

In this case, the structuring element is a circle. It is to be noted that:

$$D(x,\rho) = \{y \in R2 | d(x,y) \leq \rho\}$$

Said circle is a disk which has x for centre and $\rho$ for radius. In other words, point y of space R2 belong to the disk if the distance separating this point from the centre is shorter than or equal to the radius.

The distance between a point x and a set X of R2 is defined as follows:

$$d(x,X) = \inf d(x,y) \text{ with } y \in X$$

The disk with centre 0 and radius $\rho$, i.e. $D(0,\rho)$ is referenced $\rho D$.

Set "X expanded by $\rho D$" is such that:

$$X \oplus \rho D = \{x \in R2 | d(X,y) \leq \rho\}$$

In the same way, "X eroded by $\rho D$" can be defined such that:

$$X \ominus \rho D = \{x \in R2 | D(x,\rho) \subset X\}$$

(d) properties

It can be established that set "A expanded by B" is identical to the complementary set of set complement of "A eroded by B", i.e.:

$$A \oplus B = (A^c \ominus B)^c$$

All these transformations of the "full or nil" type are iterative. Then, it is possible to define two other operations.

An opening operation: it is an erosion followed by an expansion.

i.e. $(A \ominus B) \oplus B$

A closing operation: it is an expansion followed by an erosion.

i.e. $(A \oplus B) \ominus B$.

These last two transformations will be used to clean the images.

In general, an erosion suppresses the portions of the image which are smaller than the structuring element. (Therefore, it is the same for the expansion over $A^c$).

An opening operation suppresses all the portions of A which are smaller than the structuring element without modifying the remaining portion of the image. (A closing operation has the same effect on $A^c$).

II. DIGITALLY PROCESSING THE IMAGE

Figure 3:
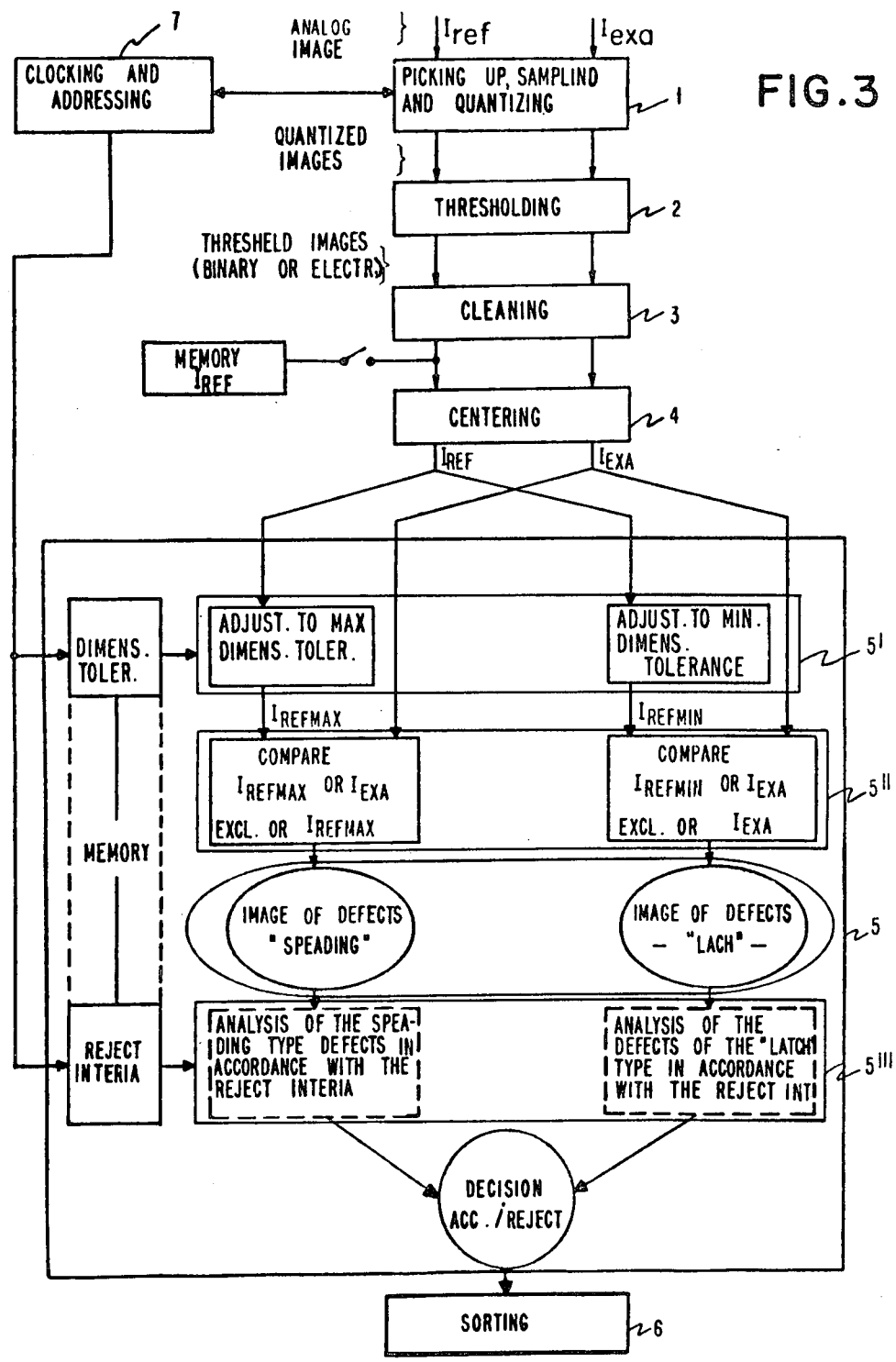
FIG. 3 is a flowchart representing the various steps of the inspection and sorting process of this invention.

The various basic steps are shown in the flowchart of FIG. 3 and bear reference numbers 1 to 6.

1. Picking up, sampling and quantizing the image The images of the reference module ($I_{ref}$) and of the module to be inspected ($I_{exa}$) provided by the pick up device are, for instance, in black and white with all the levels of grey. First of all, these analog images are sampled according to an hexagonal or square frame, for instance. The signal amplitude is quantized for each point of the image and this information is coded over four bits. The image can comprise a number of lines and of bits per line varying with the various application. In general, 1024 or 2048 lines are satisfactory in most cases. In this application, 2048 lines of 2048 bits have been chosen, i.e. with a 2.54×2.54 cm module, one has a pitch of 12.5μ between two images points (pixels), i.e. four millions of points to be processed.

2. Thresholding

Only the geometry of the module patterns is taken into account in the automatic processing of defects. Therefore, this leads to process binary images obtained after thresholding.

Any point of the image showing a level of grey exceeding a certain threshold, will be made equal to 1. Below said threshold, any point of the image will be made equal to 0. This step allows binary images in black and white to be obtained. The problem which appears relates to the detection of the correct threshold for the modules to be analysed.

Figure 4:
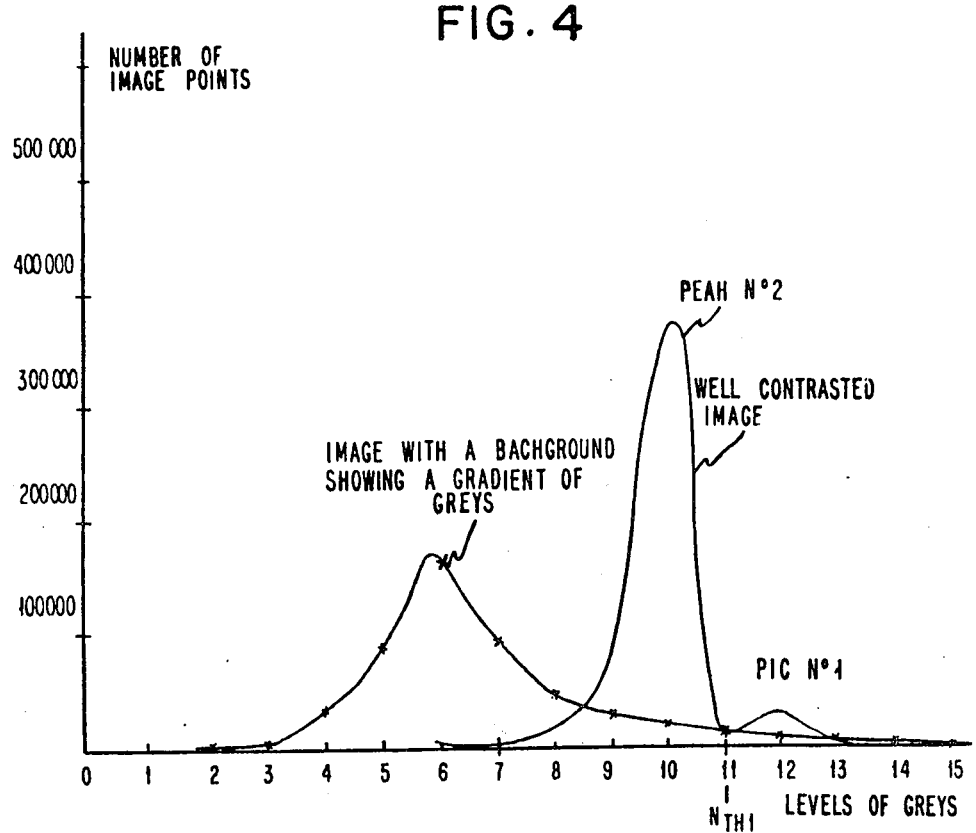
FIG. 4 is a frequency curve representing the distribution of the "image" points or picture elements (pixels) according to the signal amplitude for two images, the first image being very contrasted and the second one showing a background with a grey gradient, both images being in black and white with sixteen grey levels.

An appropriate thresholding technique based upon the construction of the image frequency curve is described below while referring to FIG. 4. For the images with 16 levels of grey and well contrasted, the frequency curves show two peaks or modes which are well differentiated and represented on one of the curves of FIG. 4. Peak No. 1 shows the distribution of the module patterns while peak No. 2 shows the distribution of the image background. To detect the correct threshold, it is sufficient to choose value $N_{TH}$ of the threshold corresponding to the valley between the two peaks. As to the example of the curve corresponding to a well contrasted image, one has $N_{TH}=11$. Thus, all the points of the image under analysis which show a level of grey exceeding 11, will be provided with a binary 1 value while all the other points will be provided with a binary 0 value.

When the image background shows a gradient of grey, the valley between the two peaks becomes less deep and it becomes difficult to choose the optimum threshold. Thus, for this type of image, the threshold can be chosen in various ways, in particular by processing the images region by region. The threshold of each region is detected from its frequency curve. Then, the resulting thresheld image is comprised of all the thresheld regions. A frequency curve characterizing an image of this type is given by curve No. 2 of FIG. 4. In this case, the experiment shows that threshold value $N_{TH}$ can be chosen equal to 7. In a great number of cases, a program can be used for automatically detecting the threshold through the analysis of the frequency curve of the intensities of the image points of the image which is analysed.

Various techniques including the above-indicated ones, are described in the article entitled: "A Survey of Edge Detection Techniques" of Larry Davis published in "Computer Graphics and Image Processing" (1975), 4, pages 248–270 and more particularly in the portion relating to the article of C. K. Chow.

3. Cleaning

Cleaning is performed by erosion to suppress all the image points related to noise. The size of the structuring element which is going to erode the image should be smaller than the size of the smallest defect which is to be detected. The portions smaller than the erosion size disappear while the other ones remain and therefore, are reconstructed by an expansion of the same size. (Generally stated, this operation is of the opening type). In accordance with the nature of the points related to noise which are to be suppressed in the image, either an opening operation, or a closing operation or even a combination of both operations successively carried out, is applied to the image. The expand operation is carried out in a symmetrical way; the complementary image of the frame is eroded and the result complement is taken out as indicated in the following relation:

$$A \oplus B = (A^c \ominus B)^c$$

Also, cleaning can be performed after the centering step. At last, this step is optional and depends on the image quality.

In practice, for carrying out these mathematical morphology operations as erosion and expansion, various structuring elements can be chosen and, more particularly, in accordance with the frame in use. On the quantizied and threshled image (a so called binary or electronic image) sampled in accordance with the hexagonal frame, it is possible to choose the hexagon form which is the structuring element the closest to the circle. Let us assume that one has a hexagon of size n and that the product of the sampling pitch by n represents the circle radius. In this case, for a size 1 erode operation for instance, all the image points are structured by the structuring element which will be a hexagon of size 1 (the smallest hexagon of the sampling mesh). All the apexes of the hexagon as well as its centre, are made equal to 1. The hexagon is centered on the point to be analysed. If the hexagonal vicinity of each point as well as the point itself, coincides with the values given to all the apexes of the hexagon (centre included), then the initial point takes a binary 1 value. If not, it takes a binary 0 value. In other words, any binary point equal to 1 provided with at least an adjoining point equal to 0, is suppressed from the image while the binary points equal to 0 keep their value. Therefore, the image has been submitted to a transformation of the "full or nil" type.

An example of an erosion operation clearly appears on FIG. 5. A conductor portion has been chosen as the initial image.

As to the expansion operation, it is possible to operate either directly from the initial image or to erode the complement of the initial image, then to complement the result.

If a square frame is used, it is possible to use an approximative cross or circle shaped structuring element. The size and the pattern of the structuring element can vary in accordance with the type of the application. In this description, the square frame and a circle shaped structuring element of variable size will be used to provide a better understanding of the invention. The number of the image points (pixels) can vary from 500,000 to 10 millions or more, according to the various applications.

4. Centering

Before comparing the reference image with the sampled image, it is necessary to recentre both images in space. This operation must be automatic and can be program controlled. Various techniques for centering or aligning masks are well known by the man skilled in the art (for instance, by using flags or reference marks), can be used. An appropriate recentering technique is described below while referring to FIG. 6.

Figure 6:
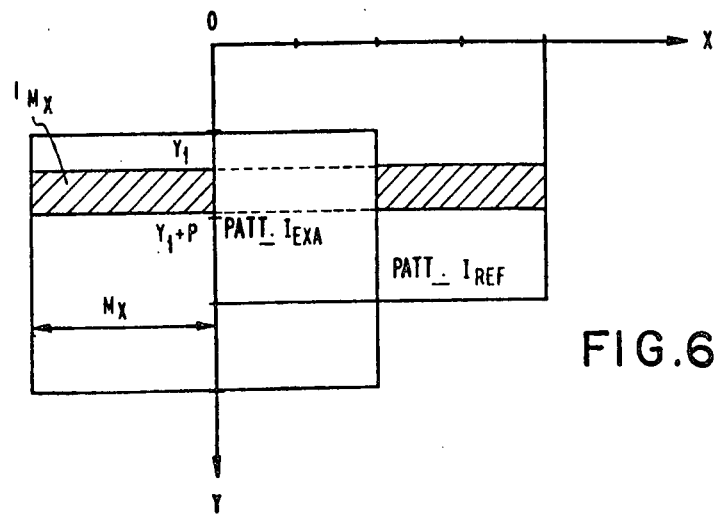
FIG. 6 shows a pattern of the image of the reference object and a pattern of the image of the object to be inspected, which must be centered.

Two patterns are schematically shown on FIG. 6. A pattern belongs to reference module image $I_{ref}$ and the second pattern belongs to sample module image $I_{exa}$.

The second pattern is not aligned with the reference image pattern. These patterns can consist in portions of flags or reference marks which are in current use for aligning masks, modules, etc,.

A program allows the offsetting between the images on axis x and y, to be calculated.

To calculate this offsetting on axis x which is represented by $M_x$, it is sufficient to take some successive lines y (from a determined line $y_1$) crossing both images and to calculate hachured surface $I(M_x)$. FIG. 6 shows that the more $I_{ech}$ is offset to the right (by steps on axis x), the smaller is surface $I(M_x)$. Said surface tends to a minimum when maximum recentering on axis x is attained.

To carry out a faster calculation, the program computes only a limited group of p lines for the offsetting on axis x and of q columns for the offsetting on axis y.

The parameters ($y_1$ and p, as to the offsetting on axis x) are chosen at the program entry. Therefore, this program consists in analysing function $I(M_x)$ which represents the hachured surface according to the different values of offsetting $M_x$ (offsetting between both images on axis x).

Then, the program automatically determines value $M_x$ at a minimum of function $I(M_x)$.

The same process is carried out for the offsetting on axis y by taking vertical lines parallel to axis Oy, which leads to determine $I(M_y)$ and $M_y$ by using corresponding parameters ($x_1$,q).

Figure 7:
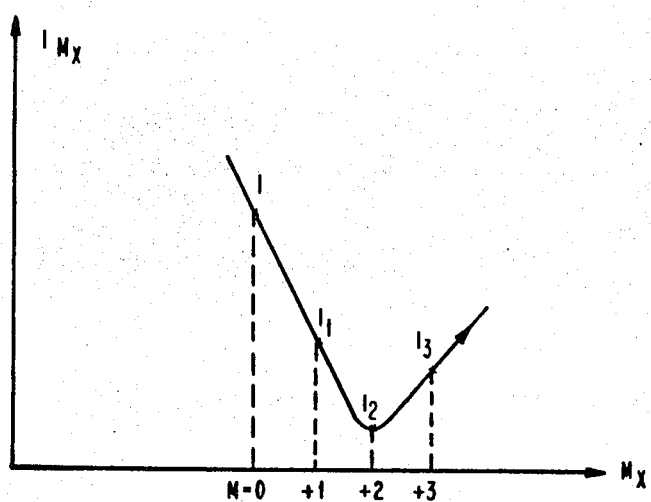
FIG. 7 shows curve I(Mx) representing the hachured area shown on FIG. 6 and which is proportional to offsetting Mx of the patterns and its variation in function of the displacement of the object to be inspected.
Figure 8:
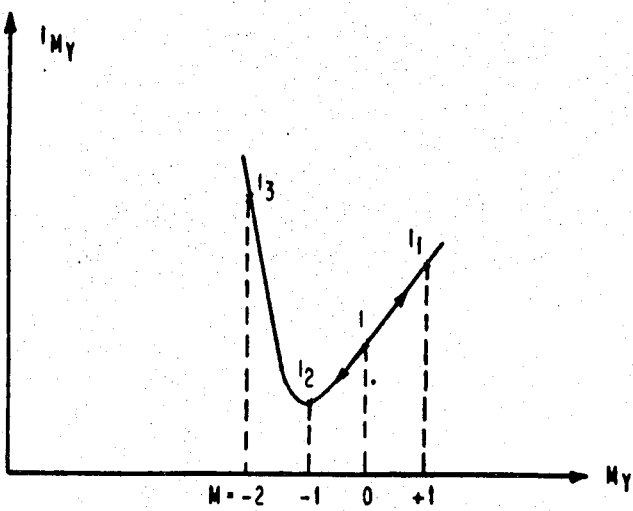
FIG. 8 is a similar representation of curve I(My).

When taking the pattern shown on FIG. 6 as an example, the result of these logical operations appears as the curves shown on FIGS. 7 and 8. These figures show $I(M_x)$ and $I(M_y)$ which indicate the minima for certain values of M. FIG. 7 shows that function $I(M_x)$ decreases from initial value I by taking values $I_1$, $I_2$, before increasing and taking value $I_3$ for different values of $M_x$ when $I_{exa}$ has been offset to the right by successive steps. The minimum of $I(M_x)$ is obtained for two steps. Then, it is necessary to move $I_{exa}$ by two steps to the right. In the same way, FIG. 8 shows $I(M_y)$ and that a first attempt ($I_1$) to the right is made in the wrong direction since $I_1 > I$, then to the left. Therefore, the minimum is obtained for a step towards the negative values of y.

This recentering step can be easily program controlled.

Since only a portion of the image is chosen, it is necessary to check that these lines effectively cross the patterns of the module under analysis for both the sample and the reference modules and not only for the background. The choice is readily made from the reference image which is known at the beginning and which allows these parameters ($x_1$, $y_1$, p, q, ...) to be determined. In addition, in order to obtain the desired results from the offsetting calculation, it is necessary that each pattern of $I_{ref}$ overlaps the corresponding pattern of $I_{exa}$. This can be ensured through an approximate centering operation performed when picking up the images. After having successively picked up, sampled, quantized, thresheld, cleaned and centered the images, the binary image resulting from the reference object is referenced $I_{REF}$ and the binary image resulting from the object to be inspected is reference $I_{EXA}$. It should be understood that in certain applications, the recentering operation can be performed either in plane (x, y, $\theta$) or even in space (x, y, z).

5. Showing defects 5.1 Forward: Case of the modules showing patterns with constant tolerances.

In the semiconductor integrated circuit industry, it is known that the objects to be compared consist essentially in masks (reticles, integrated circuit chips and electronic modules. In every case, there are dimensional tolerances concerning the patterns provided on these objects. For instance, in the modules, the width of the conducting lines is provided with dimensional tolerance.

All the dimensional tolerances are known constant on all the object to be analysed (it is the case of the module shown on FIG. 6). Some others vary in accordance with the location of the patterns on the object (it is the case of the improved module shown on FIG. 1A of this application). Further, it has been noted that two main types of defects appear on the modules; (1) the defects of the "lack" type, the "lack" portion being what is missing on the image of the module to be inspected with respect to the image of the reference module, and (2) the defects of the "spreading" type, the "spreading" portion being what is added on the image of the module to be inspected with respect to the image of the reference module.

Figure 9A:
FIGS. 9A, 9B and 9C show various defects of the "spreading" type.
Figure 9B:
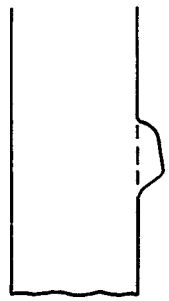
Figure 9C:
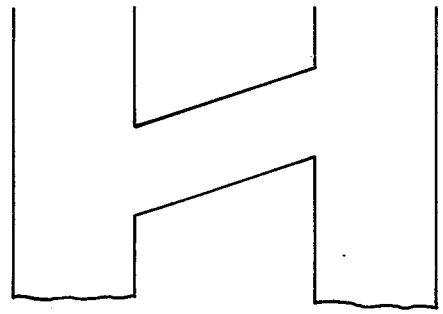
Figure 10A:
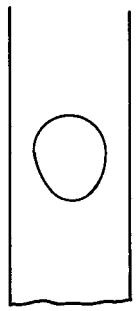
FIGS. 10A, 10B, 10C and 10D show various defects of the "lack" type.
Figure 10B:
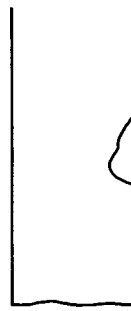
Figure 10C:
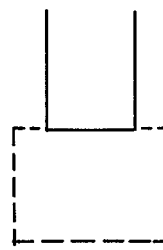
Figure 10D:
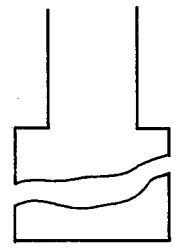

In this domain, the defects can have various shapes some of which among the most typical ones, are shown on FIGS. 9 and 10.

(1) Defects of the "spreading" type

They are of three main sub types:
(A) the "island" sub type (parasitic pattern)
(B) the "spreading along a pattern" type
(C) the "bridge" type (between two patterns)

Parts A, B and C respectively represent these defects on FIG. 9.

(2) Defects of the "lack" type

They are of four main sub types:
(A) the "hole" type (a hole in a pattern)
(B) the "cut out" type
(C) the total lack of a pattern
(D) the "break" type (a broken pattern)

Parts A, B, C and D respectively represent these defects on FIG. 10.

In the present case, only objects with constant tolerances are considered. It is the case of the module shown on FIG. 6 of the present application. Then, there are only two reject criteria to be applied: the criterion relative to the defects of the "lack" type and the criterion relative to the defect of the "spreading" type. A map or an image of the defects will be established for each type of defect by processing differently images $I_{REF}$ and $I_{EXA}$ to be compared.

To determine the defects of the "spreading" type while taking the maximum allowed width into account, $I_{REF}$ is expanded to the size of the dimensional tolerances, which gives $(I_{REF})_{max}$, then $(I_{REF})_{max}$ is compared to $I_{EXA}$ by performing the following complex logical operation:

$$[(I_{REF})_{max} \text{ OR } I_{EXA}] \text{ EXCL. OR } (I_{REF})_{max}.$$

If the resulting set or defect image is not empty, this indicates the presence of defects of the "spreading" type. This logical operation is chosen because it allows the defects of the "spreading" type to be especially selected. As to the defects of the "lack" type, $I_{REF}$ is eroded to the size of the dimensional tolerances, which gives $(I_{REF})_{min}$. Then $(I_{REF})_{min}$ is compared to $I_{EXA}$ by performing the following complex logical operation:

$[(I_{REF})_{min}$ OR $I_{EXA}]$ EXCL. OR $I_{EXA}$

If the resulting set or defect image is not empty, this indicates the presence of defects of the "lack" type. This logical operation is chosen because it allows the defects of the "lack" type to be especially selected. It should be noted that the structuring element of the expanding and eroding operations is identical for both operations since the minimum and maximum dimensional tolerances are equal. Therefore, finally, one obtains two images of the defects, one showing the "spreading" type defects and the second one showing the "lack" type defects.

Other logical operations can be performed, in particular if only one defect image is desired.

5.2 Generalizing to the Case of modules showing patterns with tolerances and criteria varying with the location of said patterns.

The above-described process remains the same when it is applied to modules with tolerances varying with the location of the pattern (step 5 of FIG. 3). But it should be modified so that the adjustment to the dimensional tolerances and the reject criteria depend on the region of the pattern. In other words, the structuring element of operation 5' ensuring the adjustment to the variable tolerances and the reject criteria of operation 5'" vary with the location of the patterns. FIG. 3 shows a device 7 which is essential to embody this invention. This timing and addressing device ensure an appropriate order and performance of the operations (in real time). In synchronism with the scanning of $I_{exa}$ (and of $I_{ref}$, if required), it controls, for each pixel, the operations required to adjust the defect to the dimensional tolerances (5') and to analyse said defect with respect to the reject criteria relating to this pixel (5'"). Device 7 is associated to a memory which contains two data tables, one table for the defects of the "lack" type and one table for the defects of the "spreading" type. The first table contains for each pixel the data relating to the value of the dimensional tolerance and the reject criteria for this point. The analysis of the defects of the "lack" type only requires, in fact, the indication of the width and direction of the conductor containing the pixel under inspection. Therefore, it is from this information that the above indicated data are elaborated. These two data will allow $I_{REF}$ to be adjusted to the dimensional tolerances and the reject criteria for each pixel to be provided. Therefore, the information relating to the width and direction of the conductors are predetermined and used as a base to compute the useful data which are the tolerance value and the reject criteria to be stored into a memory as a first data table.

It is the same for the analysis of the "spreading" type defects which requires the storage of a second table into a memory. Said second table contains the following useful data: the tolerance value and reject criteria for each pixel of the image, calculated from the width and direction of the conductor interspace.

In other words, the first table will be constructed from $I_{REFc}$ while the second table will be constructed from $I_{REF}$.

In the application relating to the modules shown on FIG. 1A, the conductors can have three widths: 100, 125 and 250μ and four directions: 0°, 45°, 90° and 135°. For each pixel of a determined conductor of $I_{REF}$, it is necessary to determine the width and the direction of the conductor containing said pixel. To carry out this determination, one computes the number of pixels along each of the four directions of the conductor. A program must allow the width and the orientation of the conductor to be determined without any manual operation. This process requires approximately 16 bits per pixel, i.e. 4.2 millions of 16-bits words for $I_{REF}$.

This number is obviously too important when we reconsider the room practically available in the memory. Then this number can be reduced by dividing $I_{REF}$ into regions. Preferably, these regions appear as the squares of a checker board which corresponds to $I_{REF}$. A dimensional tolerance and the reject criteria for the defects of the "lack" type and of the "spreading" type, respectively, will be associated to each square of the checker board. A size of 16×16 pixels is chosen for each square, which provides only 16984 words of 16 bits to be stored. This size has been chosen in order to optimize the room required in the memory and to ensure a minimum conductor density within each square, i.e. a maximum of two conductors in each square. However, this invention is not limited to this choice. If the size of the squares allows a square to be provided with two conductors, the following rules can be taken into account. If the two conductors are identical, the widths and directions computed for all the pixels of the square, are identical. The reject criterion and the width allowed by the dimensional tolerance can be easily deduced from these values. When the two conductors have different widths and/or directions, the smallest value of the tolerances computed for all the pixels of the square and the tightest reject criterion are to be retained.

5.2.1 Establishment rules and contents of the data tables for both types of defects:

(1) Defects of the "lack" type

For each possible width of the conductors, the inspection instructions define the acceptable size of the defects. Parameters other than the width can also be taken into account. For instance, the length of the defect for a determined width of the conductor. For example, the following instructions can be found for a conductor, nominal width L of which is equal to 125μ.

Figure 11A:
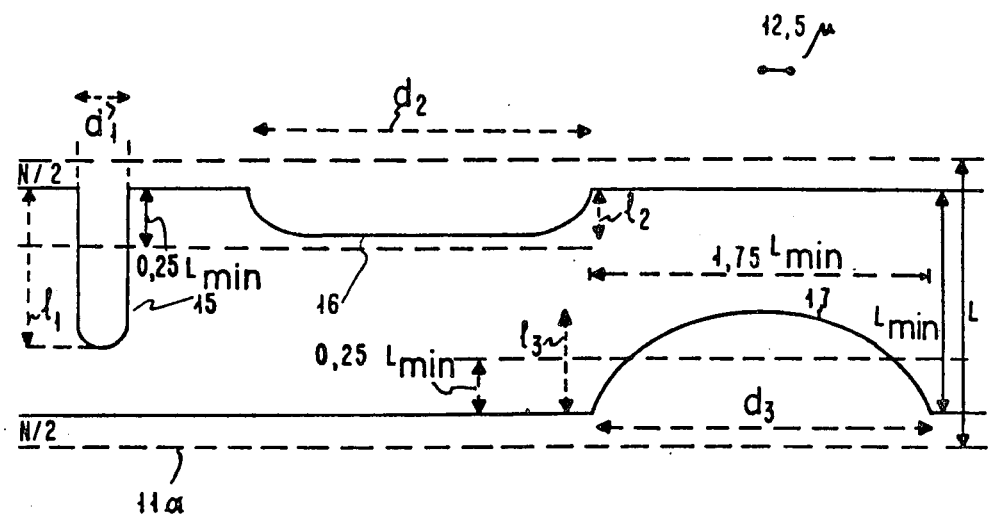
FIG. 11A illustrates an enlarged portion of a conductor of the module shown on FIG. 1A, said enlarged portion showing defects of the "lack" type, which allows the reader to understand the determination of the reject criteria for these defects.

To be acceptable, a defect should not reduce the conductor width by more than X%=25%. However, if the defect reduces the width by more than 25%, it is accepted if its length d is lower than or equal to kL (k=1.75). But, said defect should never reduce the conductor width to a value lower than a minimal value A which is equal to 25μ. Therefore, parameters X, k and A which obviously vary with the widths of the conductors, constitute the basis of the reject criteria for each square. In fact, to ensure a better safety, these instructions will be applied by performing a comparison not with $I_{REF}$ but with $(I_{REF})_{min}$ (i.e. after having adjusted the reference image to dimensional tolerances N). FIG. 11A shows a conductor portion of nominal width L=125μ which is supposed to be contained in the same square. The conductor width is adjusted to the minimum dimensional tolerances (N=25μ for L=125μ). Therefore, its width becomes equal to $L_{min}$=100μ. Three defects are shown. Defect 15 is acceptable although its width $l_1$ exceeds 0.25 $L_{min}$, its length $d_1$ is lower than 1.75 $L_{min}$ and it does not reduce the conductor width 11a to its minimum value of 25μ. Defect 16, width $l_2$ of which is lower than 0.25 $L_{min}$ is acceptable. It is to be noted that this defect can have a length $d_2$ of any value. Defect 17 is also acceptable for the same reasons as defect 15. It is recalled that if in a square, the conductor width changes, for instance increases from 125 to 250μ, the tightest dimension tolerance and reject criteria should be taken into account.

In fact, as the conductors can have four possible directions: 0°, 45°, 90° and 135°, the projections of the "lack" type defect will be calculated in the conductor direction (width l of the defect) and in the perpendicular direction (length d of the defect). This determination is important, the reject criteria being mainly based on the comparison of d and l with k $L_{min}$ and X% $L_{min}-A$, respectively, for a determined orientation ($\theta$).

Briefly stated, as to the image of the "lack" type defects, it is possible to associate to each square a dimensional tolerance (N) function of the conductor width (L or $L_{min}$), and reject criteria function of this width and of its direction ($\theta$).

(2) Defects of the "spreading" type

Figure 11B:
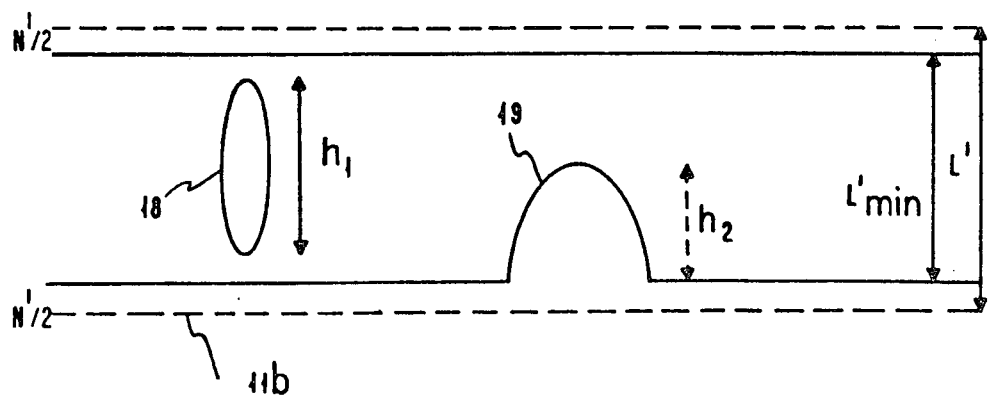
FIG. 11B illustrates an enlarged portion of a conductor interspace on the module shown on FIG. 1A, said enlarged portion showing defects of the "spreading" type, which allows the reader to understand the determination of the reject criteria for these defects.

The same process can be applied for the image of the "spreading" type defects. When the complementary image of the reference module is analysed, the width and direction of the conductor interspace is obtained for each pixel of $I_{REF}{}^c$. The pixels belonging to the conductors do not intervene any longer in the definition of the reject criteria for the defects of the "spreading" type. $I_{REF}$ is expanded in accordance with the control instructions in function of the width of the conductor interspace which is considered. This comes up also to establish a value (N') of the dimensional tolerances for the conductor interspace which ensures the same function as (N) established for the conductor width. It is to be noted that the expansion of the conductors of $I_{REF}$ by N' is equivalent to the erosion of the conductor interspace by N'. In certain squares, it is possible than N=N'. As to the reject criterion, the principle which is applied is as follows: any defect should let a minimum cumulative conducter interspace B determined by the control instructions (the length can have any value). In fact, in this case it is also its projection h in the direction of the conductor interspace which is taken into consideration. $I_{EXA}$ will be compared to $(I_{REF})_{max}$ which is the reference image expanded by N', i.e. the dimensional tolerance for nominal width L' of the conductor interspace. In this case, the reject criterion becomes $X \leq L'_{min} - B$ where $L'_{min}$ is the value of conductor interspace L' after erosion to dimensional tolerances N'. It is obvious that B varies with the width of the conductor interspace which is considered, for instance B=25μ for an interspace $L'_{min}$ of 100μ. FIG. 11B shows a conductor interspace 11b and two acceptable defects 18 and 19, projections $h_1$ and $h_2$ of which satisfy the following rule $\leq 1'_{min} - B$. When the pixels of a same area present two conductors interspaces of different widths, expansion size (N') and the reject criteria are the ones of the narrowest conductor interspace. When conductor interspaces of same width but with different directions are found in a square, it is necessary to compute the defect projections in the four directions, and the rule should be satisfied in each direction.

When two conductor interspaces of different width and directions, are found in a square, the expansion size and the reject criterion will be the ones of the narrowest interspace.

It is to be understood that the dimensional tolerances (N and N') as the reject criterion, lead to values which can only be multiples of the sampling pitch (in this case: 12.5μ).

Finally, one obtains two data tables which appear as follows:

Data table No. 1 corresponding to the defects of the "lack" type.

For each square, parameters $\theta$, X, A, k and L are intercombined by using a computer to represent the reject criteria which, as seen above, are essentially functions of $\theta$, $L_{min} - A$, X%$L_{min}$ and k $L_{min}$.

| Square No. | Dimensional tolerances | Reject criteria |
|---|---|---|
| 1 | $N_1$ | $\theta_1, L_{1\ min} - A_1$, $X_1\% L_{1\ min}, k_1 L_{1\ min}$ |
| 2 | $N_2$ | $\theta_2, \ldots$ |
| . | | |
| . | | |
| n | $N_n$ | $\theta_n, L_{n\ min} - A_n$, $X_n\% L_{n\ min}, k_n L_{n\ min}$ |

For square No. 1, the useful dimensional tolerance for eroding $I_{REF}$ is $N_i$ and the reject criteria are $\theta_i$, $L_{i\ min} - A_i$, $X_i\% L_{i\ min}$, $k_i L_{i\ min}$ which gives the orientation and the size of the acceptable defects. A similar defect table No. 2 (for the defects of the "spreading" type) is also established. For square No. 1, the dimensional tolerance will be $N'_i$ and the parameters, $\theta'_i$ and $B_i$.

5.2.2 Process for establishing data tables

When the number of squares is not very important, for instance lower than 100, an operator can inspect the reference module and by virtually superimposing a check board, he can input these various parameters into the memory. However, as soon as this number is exceeded, it is more interesting to use a system for automatically generating these tables containing the dimensional tolerances and the reject criteria. These tables will be addressed by applying a particular technique for addressing the check board. The contents of these tables is established from a technique based on the calculation of the greatest through lengths.

The tables will be automatically loaded when performing a preliminary step by analysing $I_{REF}$ as described in the following. Then, when inspecting and sorting each module to be inspected, the data corresponding to the square containing each pixel of $I_{EXA}$ will be associated to each of said pixels.

Automatic Generation of Data Tables (1) Check board addressing mode

This process implies the simultaneous addressing of coordinates X and Y of the point under inspection and of the square containing said point so that the corresponding words stored in the memory can be available and controlled, after decoding, the various operations of step 5. An example will be described with an image of 16×16 pixels (256 image points) and with a check board of sixteen squares, the dimensions of each square being of 4×4 pixels.

The word at address

| 0000 | contains the data of square No. 1 |
|---|---|
| 0001 | contains the data of square No. 2 |
| . | |
| 1111 | contains the data of square No. 16 |

Addressing X is carried out on 4 bits A, B, C, D. Addressing Y is also carried out on 4 bits E, F, G, H. The two bits of X (AB) with the higher weight are associated to the two bits with the higher weight of Y(EF). One word of four bits EFAB is constructed and corresponds to the address of the desired square of the check board.

The following table shows the method used for addressing the check board.

```
D   0 1 0 1 0 1 0 1 0 1 0 1 0 1 0 1
C   0 0 1 1 0 0 1 1 0 0 1 1 0 0 1 1
B   0 0 0 0 1 1 1 1 0 0 0 0 1 1 1 1
A   0 0 0 0 0 0 0 0 1 1 1 1 1 1 1 1
    ↑ ↑ ↑ ↑ ↑ ↑ ↑ ↑ ↑ ↑ ↑ ↑ ↑ ↑ ↑ ↑
```

|  | | | | |
|---|---|---|---|---|
| 0000 - 0000 - 0010 - 0011 - | address of square No. 1 0000 | No. 2 0001 | 0010 | 0011 |
| 0100 - 0101 - 0110 - 0111 - 0111 - | 0100 | 0101 | 0110 | 0111 |
| Y 1000 - 1001 - 1010 - 1011 - | 1000 | 1001 | 1010 | 1011 |
| 1100 - 1101 - 1110 - 1111 - | 1100 | 1101 | 1110 | No. 16 1111 |

EFGH

Address 0011 of the addressable memory, contains the dimensional tolerances and reject criteria corresponding to the area of $I_{REF}$ covered by square No. 4 of the check board.

(2) Principle and calculation of the through-lengths for each pixel of $I_{REF}$ and elaboration of the data tables.

From the binary image of reference module $I_{REF}$, 4 parameters are assigned to each pixel and placed into a four-words intermediate table. These four parameters correspond to the through-length of the conductor along each of the following four directions 0°, 45°, 90° and 135° going through the pixel and given in pixels. The through-length of a pixel of value 1 in a direction is the number of consecutive pixels equal to 1 which are on the axis going through this pixel in the direction under consideration.

Figure 12:
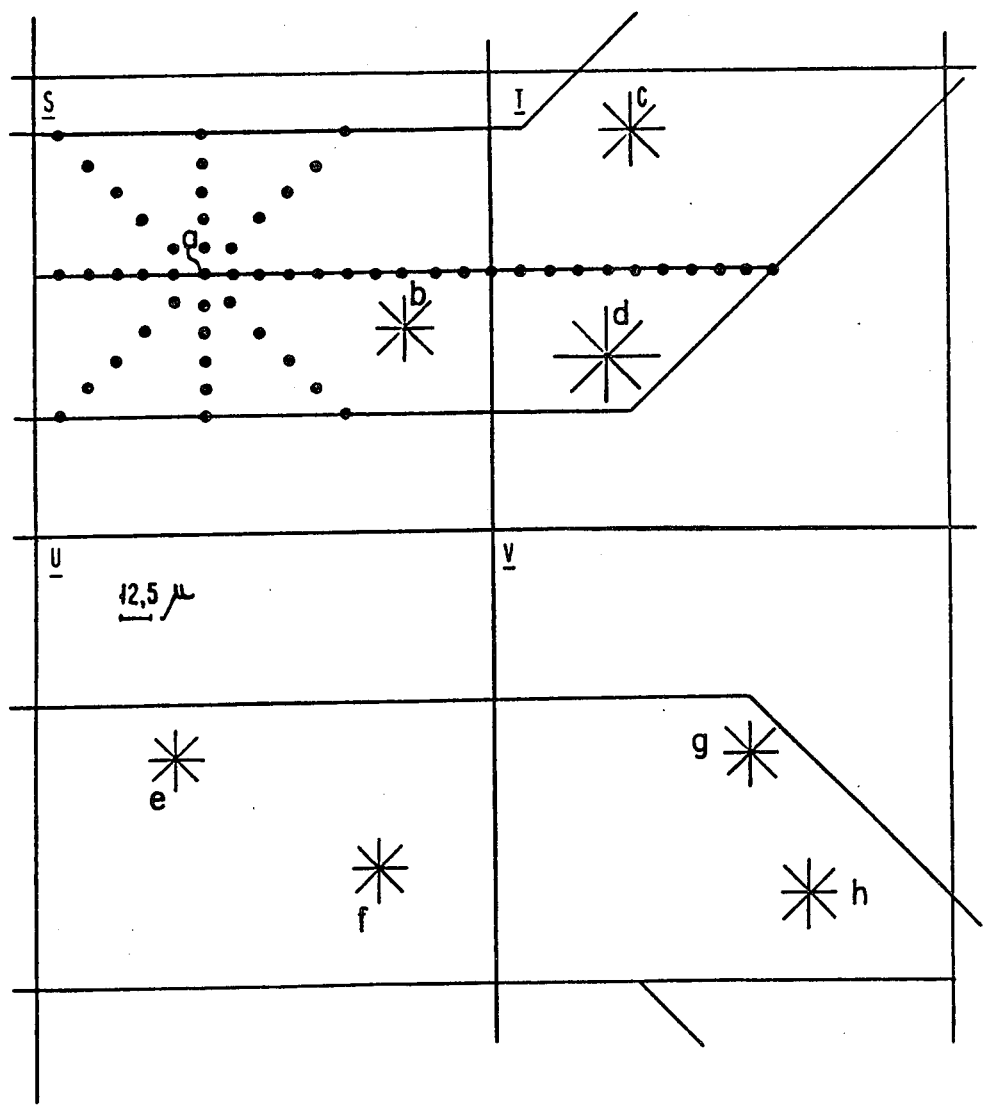
FIG. 12 illustrates an enlarged portion of the module shown on FIG. 1A, which is provided with two conductors the through lengths of which are calculated in four directions 0°, 45°, 90° and 135°.

For a matrix of 2048×2048 pixels, with squares of 16×16 pixels, there are 128×128 squares. FIG. 12 shows four adjacent squares S, T, U, and V among the 16,384 squares of the check board. Two conductor portions are schematically shown in these squares. The calculation of the greatest through-lengths for the various pixels bearing references a, b, c, d, e, f, g and h allows a portion of said intermediate table which is shown below, to be established.

| Pixel ref. for each square | | Through-lengths according to its orientation | | | |
|---|---|---|---|---|---|
| | | $t_1$ (0°) | $t_2$ (45°) | $t_3$ (90°) | $t_4$ (135°) |
| S | a | 27 | 11 | 11 | 11 |
| | b | 25 | >14 | 11 | 11 |

-continued

| Pixel ref. for each square | | Through-lengths according to its orientation | | | |
|---|---|---|---|---|---|
| | | $t_1$ (0°) | $t_2$ (45°) | $t_3$ (90°) | $t_4$ (135°) |
| T | c | 32 | >13 | 15 | 8 |
| | d | 24 | >13 | 14 | 10 |
| U | e | >28 | 11 | 11 | 11 |
| | f | >32 | 11 | 11 | 11 |
| V | g | >28 | 10 | 15 | >10 |
| | h | >33 | 7 | 15 | >13 |

The intermediate table comprises the through-lengths of all pixels of value 1 of the image.

The calculation is automatically carried out as follows (see FIG. 13):

The image is scanned from left to right from the first white point (binary 1 value) belonging to the pattern of the image. The number of consecutive white points is counted in the direction toward the end of the pattern and said number is assigned to each pixel which is encountered for their horizontal through-lengths (for instance, e and g will have the same through-length along 0°). Therefore, this through-length is stored into the first word of the table for each pixel, respectively, and the process is carried on the same line for the next pattern. The operation is repeated for the next lines in the image.

For the vertical direction the image is analysed in the same way, from the bottom to the top and from left to right and the vertical through-length for each pixel is assigned into the second word of the table.

For the diagonal direction (45°), the image is scanned from left to right in this direction. The through-length for each pixel is assigned to the third word of the table.

For the diagonal at 135°, the fourth parameter is assigned to the fourth word of the table.

Thus, a first intermediate table comprising the four white through-lengths along the four directions is associated to each pixel of value 1. For the pixels of value 0 (module ceramic substrate), value 0 is assigned to the four parameters. They will not have any weight in the definition of the dimensional tolerance and of the reject criteria for the defects of the "lack" type, For each pixel:; a computer selects the longest of the four through-lengths and deduces therefrom direction ($\theta$) of the conductor. As to the through-length along the perpendicular direction, it defines the width of conductor (L). For instance, for pixel e of square U, one has found $t_1$ exceeding 28, $t_2$ equals to 11, $t_3$ equal to 11, $t_4$ equal to 11. All the pixels of this square have corresponding through-lengths of the same order of magnitude (refer to pixels e and f). The computer deduces from this indication that the conductor of square U has a width of 10 pitches, i.e. 125$\mu$ along 0°. The program controlling this calculation is well within the skill of the man of the art and will not be described in this specification.

For each square of 16×16 pixels, finally one has two data: the width and direction of the conductor. In most cases, these 256 pixels will provide the same results. It will be easy to deduce the width and direction of the conductor present in this square from the through-lengths of these pixels. This calculation is performed by a computer for each square.

Dimensional tolerance $N_i$ in this square No. 1, is directly function of width $L_i$ of the conductor in this square. Therefore, it is easily determined by the computer. The dimensions and orientation of the analysis window are also functions of orientation $\theta_i$ and of the width of conductor $L_i$. Therefore, they will be also determined by the computer in the form of the reject criteria which have been already seen: $\theta_i$, $L_{i\ min}-A$, $X\%_i L_{i\ min}$ and $k_i L_{i\ min}$ with $L_{i\ min}=L_i-N_i\%L_i$.

In the particular cases in which the 256 pixels do not provide the same results, the following rules must be applied.

1st Case:

The conductors have the same direction but a different width. The reject criteria are the ones corresponding to the conductor with the smallest width.

For the adjustment to the minimum dimensional tolerances, the area can be eroded to the size of the one corresponding to the conductor with the smallest width.

2nd Case:

The conductors have the same widths but are orientated in different directions. (It is the case of square T of FIG. 12).

The reject criterion is to be tougher. The projections must have a maximum size which is, in this case: $(X\% L_{min})-A$, with $L_{min}$: the length of the conductor after erosion, A and B: as defined above, are functions of $L$.

3rd Case:

The conductors have different width and direction. The erosion size for the adjustment to the dimensional tolerances is the one corresponding to the conductor with the smallest width. The reject criterion is defined as in the second case, $L_{min}$ corresponding to the width of the conductor with the smallest width.

In this embodiment, to make the understanding of the invention easier, let us assume that we are in the general case or in the first particular case, i.e. that only two projections are calculated. The man skilled in the art will have to adapt the circuits of FIG. 22 and in particular, multiplexer 83, if the situations described in the second and third particular cases are likely to occur.

As to the complementary image, the same process is carried out, which provides the elements of a second intermediate table for the defects of the "spreading" type from which the computer establishes in the same way, the data of table No. 2.

It is known that the data of table No. 1 act, first of all, on the size of the structuring element when carrying out eroding operation (5') to provide $(I_{REF})_{min}$ for each square. Then, $(I_{REF})_{min}$ and $I_{EXA}$ are compared in accordance with the above-described complex logical operations (see 5.1). Then, one obtains the image of the "lack" type defects.

Then, the defect detected in a square is compared with the reject criteria contained in table No. 1 and corresponding to said defect. In practice, it is just the same as comparing values d and l characterizing the defect with data $X\% L_{min}-A$, $k L_{min}$, in accordance with the above indicated rules.

One proceeds in a similar way from table No. 2, the data of which act, first of all, on the size of the structuring element when expand operation (5') is carried out to provide $(I_{REF})_{max}$ for each square.

Then, $(I_{REF})_{max}$ and $I_{EXA}$ are compared in accordance with the above-described complex logic operations (see 5.1). Then, one obtains the image of the "spreading" type defects.

Then, each defect detected within a square, is compared with the reject criteria contained in Table No. 2 which corresponds to said defect. In practice, it is the same as comparing value h characterizing the defect with data $L'_{min}-B$ in accordance with the above-established rules. The result of this comparison determines, whether the object is to be accepted or rejected when carrying out the sorting operation.

Therefore, each square is provided with its own reject criteria as determined above, which can be applied to all the pixels contained within each square. It is to be understood that in certain cases, a samed defect can imply not only a square, but two or more, if said same defect is located for instance, in two adjacent squares. There is no problem. Each pixel of the defect is analysed by the analysis window with respect to the square reject criteria corresponding to said defect. Further, the size of the analysis window is independent from the size of the squares. For instance, in this application, one has chosen squares of 16×16 pixels and an analysis window consisting in a square of 15×15 pixels with four symmetry axes. This window will appear as an eight-pointed star (due to the four symmetries 0°, 45°, 90° and 135°) the greatest dimension of which is of 21 pixels (as shown on FIG. 16).

6. Sorting

The objects without any defect or with acceptable defects according to the reject criteria, are accepted at this level. Having identified those objects which have no defects or acceptable defects, one skilled in the art will appreciate that any number of automatic sorting apparatus is available in the art for performing this sorting step once a reject or non-reject condition has been indicated.

III. APPARATUS FOR APPLYING THE ABOVE DESCRIBED PROCESS

The process for digitally processing images of the reference object and of the object to be inspected as described in part II of this application, can be applied in various domains as indicated above and more particularly, in the semiconductor domain in which it can be more particularly used for automatically sorting modules, some patterns of which as the conducting lines, are provided with dimensional tolerances and reject criteria varying with their location. As to the modules, the images are very contrasted (practically back and white). In this case, the automatic threshold detection can be carried out without any difficulty as well as the recentering operation.

Figure 14:
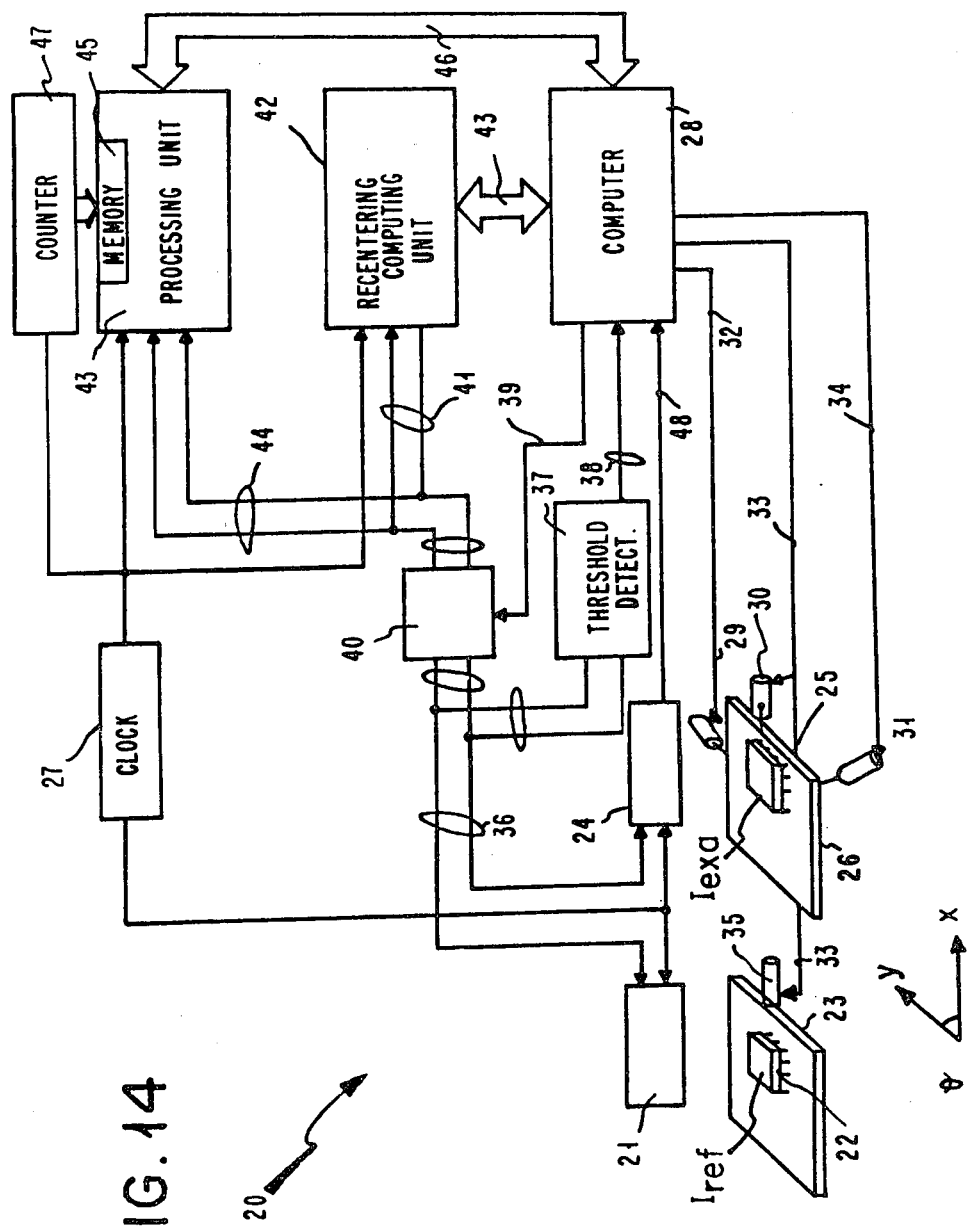
FIG. 14 is a block diagram of the apparatus and shows the various components of said apparatus.

An example of an appropriate apparatus will be described in the following while referring to FIG. 14 which is a block diagram representing the main functions used in a particular embodiment.

Apparatus 20 can be provided with various pick-up devices in accordance with the various possible applications. The pick-up device used in this application is an array of 2048 integrated photodiodes of the type fabricated by RETICON which allows a complete line of 2048 bits to be acquired. Pick-up device 21 scans reference module 22 installed on a support 23 and pick-up device 24 scans module to be inspected 25 installed on orientable support 26. These pick-up devices successively elaborate $I_{ref}$ and $I_{exa}$ and are controlled by clock 27. The reference module and the module to be inspected are previously recentered by using flags or markers before carrying out the inspection and sorting operation itself by using either an apparatus different from the one shown on the figure (of the type used to align masks), or the apparatus shown on the figure. At the beginning of this operation, module to be inspected 25 is fed and automatically installed on its support. The operation ensures a rough alignment. The program stored into computer 28 controls motors 29, 30 and 31 which recenter module 25 along X, Y and θ through lines 32, 33 and 34 so that the markers provided on modules 22 and 25 can be analysed. Support 23 is timed by motor 35 for its displacement along Y.

The analog signals representative of $I_{ref}$ and $I_{exa}$ issued from pick-up devices 21 and 24 are respectively transmitted by bus 36 to a threshold detection block 37 where they are analysed. Block 37 establishes the intensity histograms of $I_{exa}$ (grey distribution) and supplies them through bus 38 to computer 28 which determines threshold $N_{TH}$ of image $I_{exa}$. Then this value is applied through bus 39 to the input of block 40 which also receives the analog signals issued from the pick-up devices through bus 36. Images $I_{exa}$ and $I_{ref}$ are thresheld at the output of block 40. Each image point has a binary "0" or "1" value. The binary images which are obtained are referenced $I_{REF}$ and $I_{EXA}$ and provided through bus 41 to unit 42 recentering $I_{REF}$ and $I_{EXA}$, for instance by using the above-described process (I.4).

It is to be noted that for a determined module family, i.e. modules showing a same pattern of conductors, the threshold value can be determined once for all and this value is permanently displayed in block 40 for all the modules of this family which are to be inspected.

Also, there is no shortcoming in including said "recentering calculation" function into computer 28.

When a recentering operation has to be carried out, the useful elements are transmitted by bus 43 to computer 28 which computes the displacements along X, Y and θ to be controlled. Motors 30 and 33 controlling the displacements of modules 22 and 25 along Y are of the stepping type ($\Delta Y=12.5\mu$ to obtain the matrix of 2048 lines of 2048 bits which has been chosen).

In another embodiment, $I_{REF}$ can be stored in a memory of four millions of bits (see FIG. 3) which are addressed by a counter of 22 bits as controlled by clock 27. A gerber type pattern generator can directly provide this electronic image representing the metallization mask, for instance. This electronic image is recentered, as necessary, in the same conditions as the ones previously described.

Then, processing unit 43 receives perfectly centered electronic images $I_{REF}$ and $I_{EXA}$ through bus 44. This unit comprises a memory 45 which is previously charged with data tables No. 1 and No. 2, i.e. which contains the dimensional tolerances and the reject criteria for each square. This unit ensures all the operations indicated in step (I.5): adjustment of $I_{REF}$ to the dimensional tolerances, comparison of adjusted $I_{REF}$ and $I_{EXA}$, elaboration of the defect images and analysis of said defects in accordance with the reject criteria. This unit also provides the "accepted" or "rejected" decision to the computer through bus 46.

This unit is controlled by clock 27 which also controls a dual counter 47 of 22 bits. This dual counter is wired to take into account the delay necessary to output the data relating to the adjustment to the tolerances (carried out prior to the comparison operation) and the data relating to the defect analysis in function of the reject criterial (carried out after the comparison operation). This counter can be integral with the processing unit or not. The contents of this counter is the binary representation along X and Y of the point of $I_{EXA}$ under analysis. In effect, it is sufficient to count the number of clock pulses for each line to determine the address on X (which corresponds to one of the 2048 diodes) and the number of the "end of line" pulses (every $2048^{th}$ pulses) to determine the address on Y. In accordance with what is said above, the seven bits (among the eleven bits) with the highest weight of the address on X and the seven bits (among the eleven bits) with the highest weight of the address on Y are combined to form an address. This address corresponds to a square and this address is the location of the corresponding data which define the dimensional tolerance and the reject criterion for this square.

Therefore, this processing unit and the counter ensures the real-time adjustment of the dimensional tolerance and reject criteria in function of coordinates X and Y of the point being analysed of the module to be inspected. Therefore, it is possible to associate the corresponding pixel of $I_{REF}$ and its corresponding data contained in the memory to each pixel of $I_{EXA}$.

Following a line scanning by the pick-up devices, the computer detects scanning end through line 48 (it counts 2048 bits or receives an "end of line" signal) and controls motors 30 and 35 for a displacement $\Delta Y=12.5\mu$ for scanning the next line. The contents of memory 45 can be either manually or automatically charged from this apparatus on a preliminary step.

Figure 15:
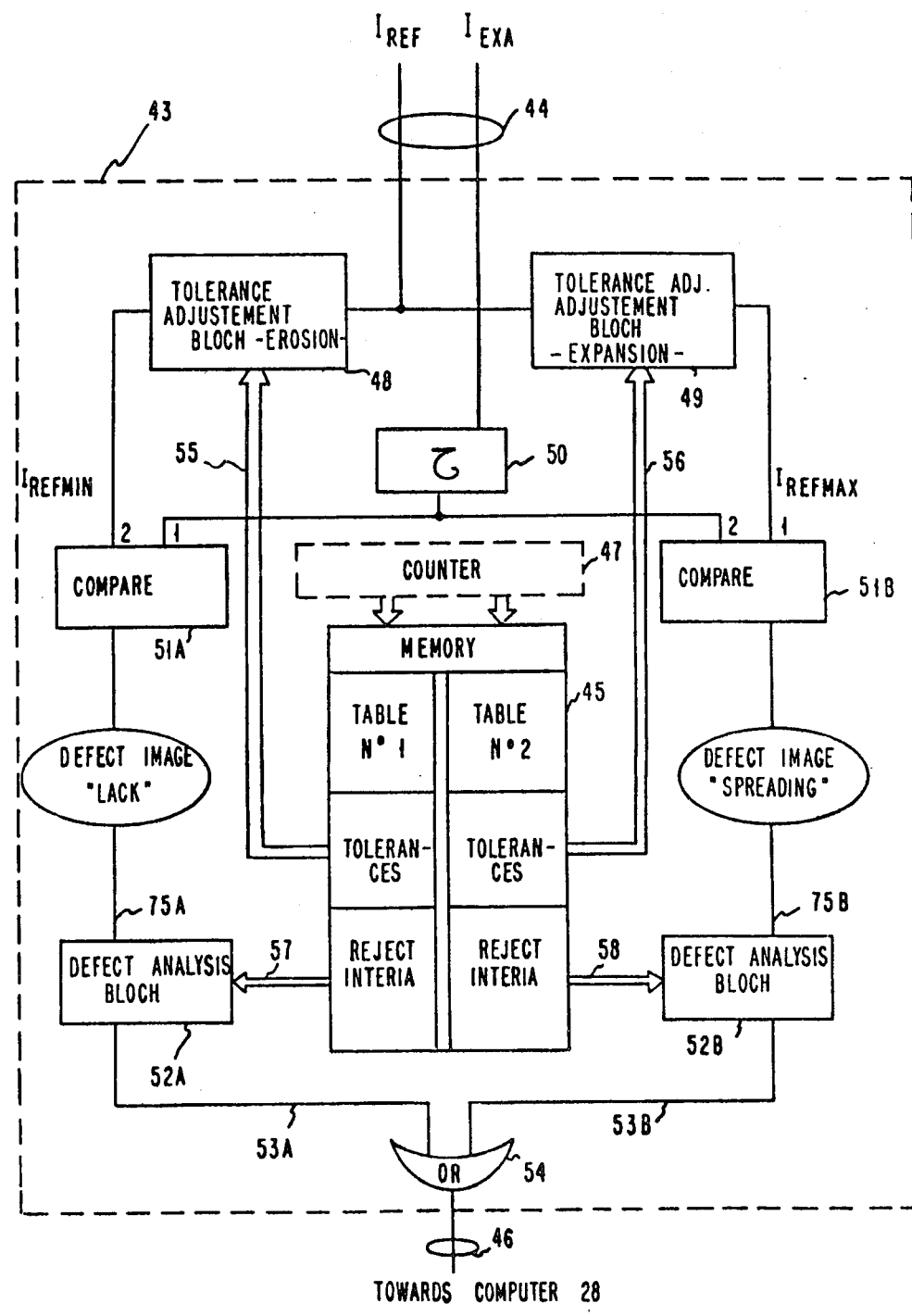
FIG. 15 is a functional diagram of the processing unit and shows the various blocks of said processing unit.

FIG. 15 is a detailed illustration of processing unit 43 which includes memory 45 which has been previously charged with data tables No. 1 and No. 2 and counter 47 which allows the data corresponding to the square containing each pixel under analysis to be associated to said each pixel. Further, it includes the various blocks provided for the adjustment to the dimensional tolerances, the comparison and the analysis of the defects. The processing operation is performed as follows: $I_{EXA}$ and $I_{REF}$ are provided through bus 44, $I_{REF}$ is adjusted to the minimum and maximum dimensional tolerances in blocks 48 and 49, respectively, to provide $(I_{REF})_{min}$ and $(I_{REF})_{max}$, respectively. These images are compared with $I_{EXA}$ (previously delayed in delay line 50) in compare circuits 51A and 51B. The resulting images of the "lack" and "spreading" type defects are analysed in defect analysis blocks 52A and 52B. The analysis results are available on buses 53A and 53B, then through OR circuit 54, on bus 46 which is connected to computer 28.

Adjust blocks 48 and 49 include decode circuits which are connected to the memory through bus 55 and 56 to adjust the erosion and expansion sizes which are variable by definition. In the same way, defect analysis blocks 52A and 52B also comprise decoding circuits which are respectively connected to the memory through buses 57 and 58 to adjust the reject criteria which are variable by definition.

The circuits constituting the counter and the adjust and analysis blocks, are controlled by block 27.

It is to be taken into account that the defect analysis operations are carried out after the tolerance adjustment operations. Dual counter 47 comprises the appropriate delay circuits (not shown).

Figure 16:
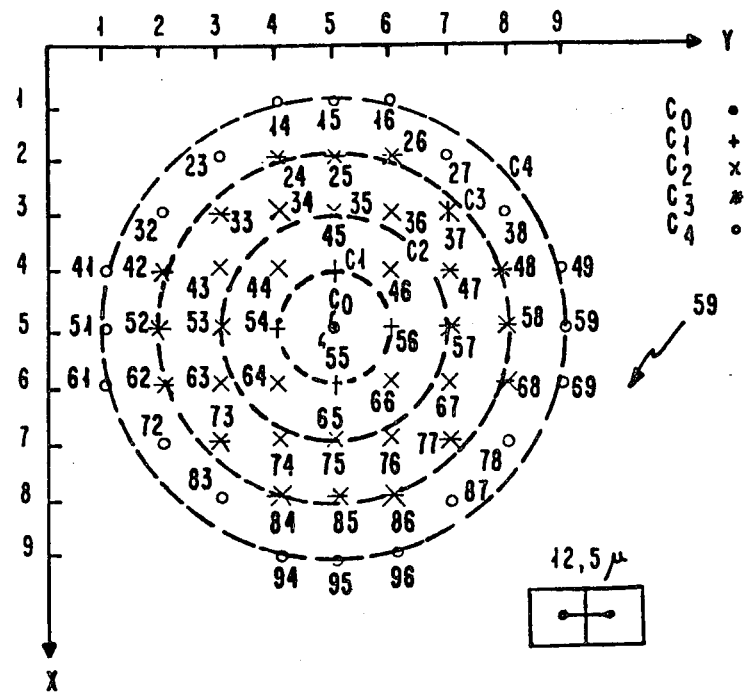
FIG. 16 shows a structuring element operating as a camera diaphragm for adjusting the object to the variable dimensional tolerances.

FIG. 16 shows a circular structuring element 59 sampled according to a square frame and developed about a central pixel 55. (A pixel referenced ij means that its coordinates are i on axis X and j on axis Y). A circular shape has been chosen for the structuring element on account of its perfect symmetry in all directions. In fact, structuring element 59 consists in central pixel 55 and in four rings C1, C2, C3 and C4. The pixels belonging to a same ring are identified with a same distinctive sign.

A pixel is shown as a point on FIG. 16. It is to be understood that with a photodiode array bar used as a pick-up device, the exact representation would have been a square of 12.5μ×12.5μ centered about this pixel. This representation can be exact with other pick-up devices.

The size of the structuring element varies from 1 to 4 times the pitch, i.e. with the structuring element of FIG. 16, it is possible to perform an adjusting operation to meet the following tolerances: N=25μ, 50μ, 75μ and 100μ (for instance, refer to FIG. 11A). If the structuring element is limited to pixel 55 or ring C0, the transformed image will be identical to the original image. If, on the other hand, a conductor is to be adjusted to the 75μ tolerances, it will be necessary to construct a structuring element comprised of rings C0, C1, C2 and C3. The data appearing in the data tables are decoded and then, control the required number of rings.

The circuit described on FIG. 17 is advantageous since the higher is the number of rings, the closer to the circle is the shape of the structuring element.

Minimum tolerance adjust block 48 on FIG. 15 is shown in details on FIG. 17. The block ensures the eroding operation with the structuring element shown on FIG. 16. It includes nine 2048-bits shift registers RD1 to RD9 which are sequentially fed. These registers store a portion of image $I_{REF}$. Each of these registers drives a 9-bits shift register provided with parallel outputs. Nine 9-bits registers RD10 to RD18 are used to construct the structuring element of FIG. 16 which is developed over nine lines and nine columns. At a given time, while the image is charged into register RD1 to RD9, the numbers of the pixels loaded in the cells of registers RD10 to RD18 are shown on FIG. 17. The cells, the contents of which intervenes for defining structuring element 59, are connected to one of four circuits 60 to 63 according to the ring including the pixel. For instance, on FIG. 16, it is shown that ring C4 comprises the following pixels: pixels 14, 15, 16, 23, 27, 32, 38, 41, 49, 51, 59, 61, 69, 72, 78, 83, 87, 94, 96. The outputs of the cells containing these numbers are, therefore, connected to the inputs of AND gate 60. It is the same for the other three rings C3, C2 and C1 which respectively correspond to AND circuits 61, 62 and 63. The outputs of AND circuits 60 to 63 are respectively connected to OR circuits 64 to 67. Each of these circuits is controlled by a decode circuit which is connected through bus 55 to data table No. 1 contained in memory 45 (FIG. 15). Decode circuit 68 applies a "1" to the OR circuit corresponding to a ring that it is not to be involved. In other words, the truth table of the decode circuit is as follows:

| θ (dimensional tolerances) | Binary contents of table No. 1 | Decode circuit output | Rings involved |
|---|---|---|---|
| — | 000 | 1111 | — |
| 25μ | 001 | 0111 | C1 |
| 50μ | 010 | 0011 | C1, C2 |
| 75μ | 011 | 0001 | C1, C2, C3 |
| 100μ | 100 | 0000 | C1, C2, C3, C4 |

The table shows that when the outputs of the decode circuit are all equal to "1", there is no ring involved. This comes up to a simple transfer of the image without any modification. The outputs of OR circuits 64 to 67 as well as the output of the cell corresponding to central pixel 55, are connected to the inputs of AND circuit 69.

Eroded signal $(I_{REF})_{min}$ in accordance with a structuring element determined by the binary value applied to the input of decode circuit 65, is available at the output of AND circuit 69.

Maximum tolerance adjustment block 49 (expanding operation) on FIG. 15 is readily deduced from the circuit shown on FIG. 17, since $$A \oplus B = (A^c \ominus B)^c$$

Block 49 is shown on FIG. 18. It is readily deduced from block 48 by inserting an inverter 70 (to obtain $(I_{REF})^c$), then by complementing the final signal through inverter 71. In other words, it is sufficient to add two inverters: one at the input and one at the output of block 48 to obtain block 49.

All the shift registers are driven by clock 27 as known by the man skilled in the art.

Reference signal $I_{REF}$, after erosion and expansion, is compared with $I_{EXA}$ in compare circuit 51.

Figure 19:
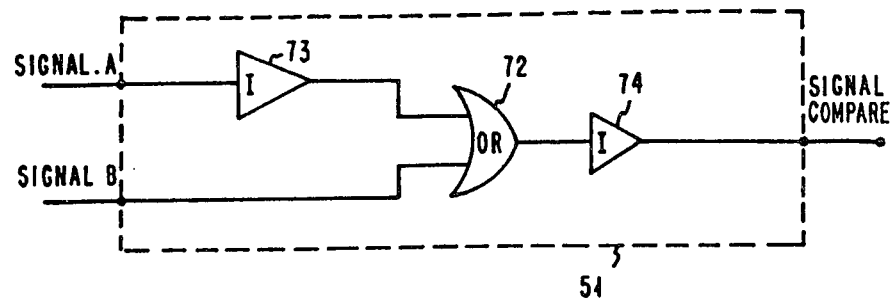
FIG. 19 is a detailed illustration of the compare block of FIG. 15.

FIG. 19 shows an example of a circuit 51 able to perform the following operation:

(SIGNAL A OR SIGNAL B) EXCL. OR SIGNAL B between input signals SIGNAL A and SIGNAL B, which is the compare operation indicated above as one (5") of the operations of step 5. Circuit 51 comprises an OR circuit 72 which receives, on the one hand, signal A which has been previously inverted in inverter 73 and signal B. The resulting signal is again inverted in inverter 74. Therefore, the output signal is as follows:

$$\overline{(\text{SIGNAL A OR SIGNAL B})} = (\text{SIGNAL A}) \text{ AND } \overline{(\text{SIGNAL B})}$$

This relation can be also written as follows:

( SIGNAL A OR SIGNAL B ) EXCL. OR ( SIGNAL B ).

If the signals representative of $(I_{REF})_{min}$ and $I_{EXA}$ are applied to block 51, one finds the signal representative of the "lack" type defects by satisfying the following relation:

SIGNAL A=$(I_{REF})_{min}$ and SIGNAL B=$I_{EXA}$

In this case, compare block 51 will be referenced 51A.

In the same way, the signal representative of the "spreading" type defects is obtained by satisfying the following relation:

SIGNAL A=$I_{EXA}$ and SIGNAL B=$(I_{REF})_{max}$ and the compare block will be referenced 51B.

After the compare operations, the images of the "lack" and "spreading" type defects are available. Now, the defects are to be analysed.

To make the understanding of the invention easier, only block 52A for analysing the defects of the "lack" type, will be described in details.

Figure 20:
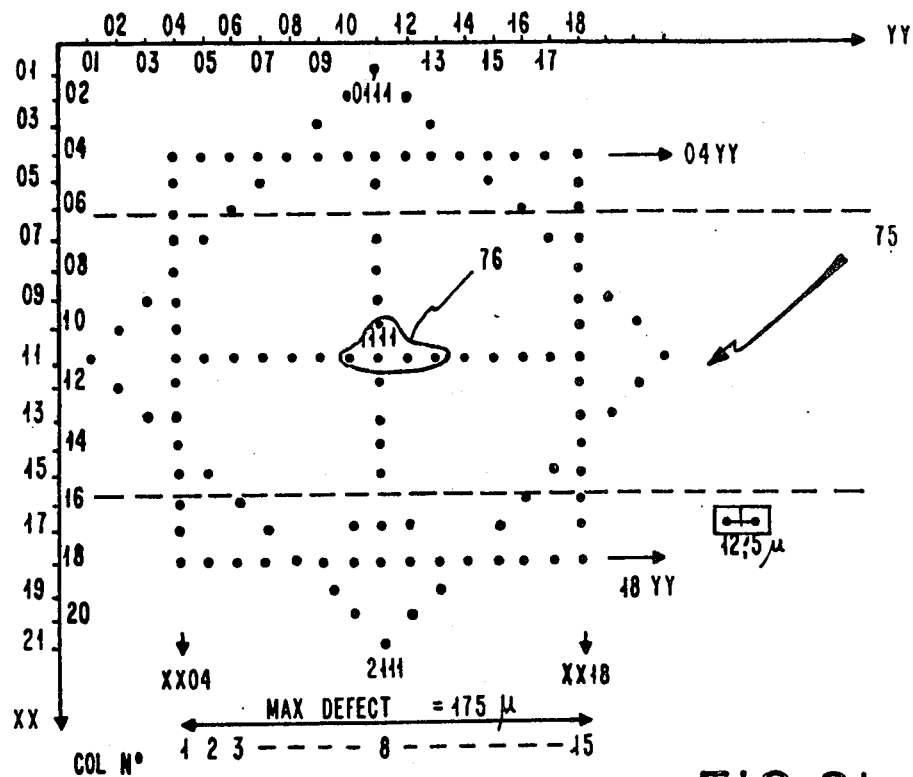
FIG. 20 illustrates a 15×15 pixels squared analysis window, showing four symmetry directions.

FIG. 20 shows an analysis window 75 of 15×15 pixels with four symmetry axes (0°, 45°, 90° and 135°). It has the shape of the eight-point star. All the pixels within this star are taken into consideration. (All the pixels are not shown on FIG. 20). The pixels are references through their coordinates along X and Y as this appears clearly on the figure. Therefore, the central pixel has 111 for coordinates. The size and shape of the analysis window are functions of the application, in particular of the maximum allowed size of the defect. A defect 76 is shown around central pixel 111 which is the pixel under analysis, by definition. Defect 76 of the "lack" type appears, for instance, on a conductor 77 of nominal width L=125μ and orientated along direction $\theta=0°$ C. (see FIG. 21). The horizontal and vertical projections of this defect are of 50μ and 25μ. The projections are split into two elements about the central pixel: P− and P+ for the horizontal projections. P−=25μ and P+=25μ. The projections are calculated from the energized photodiodes, therefore from squares 12.5μ×12.5μ which are schematically represented by pixels. The central pixel is arbitrarily considered as being a part of projection P−.

Figure 21:
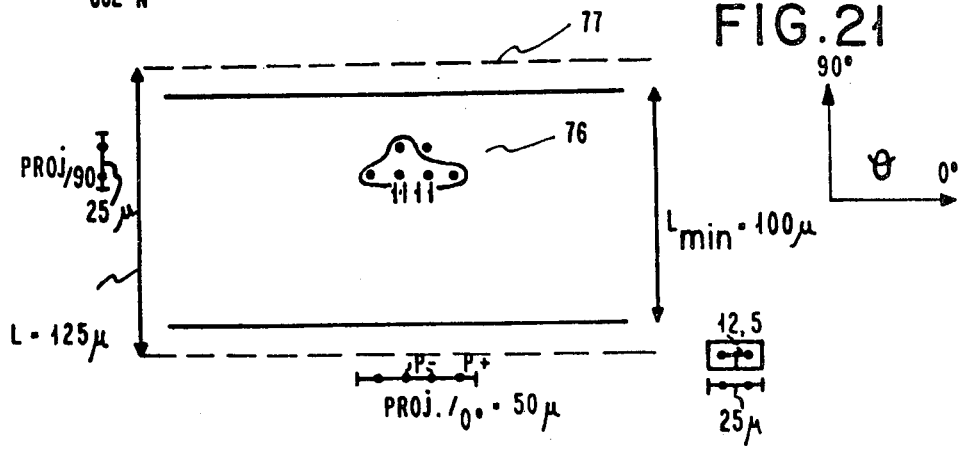
FIG. 21 shows a conductor with a typical defect of the "lack" type.

In other words, it is sufficient to count the number of pixels which are energized (or white) in accordance with the two projections and to perform a multiplication by the interval of 12.5μ to obtain the value of these projections. Defect 76 comprises four pixels along direction 0° and two pixels along direction 90°, which allows the above indicated values to be obtained. FIG. 21 also shows the data taken from data table No. 1 relating to the square containing the central pixel. For this pixel, the table indicates that the tolerance is N=25μ (this datum has been used when carrying out the minimum tolerance adjustment step in block 51A of FIG. 15), that the conductor is orientated along direction $\theta=0°$ and that the reject criteria are $L_{min}-A>75μ$, $X\% \ L_{min}>25μ$ and $k \ L_{min}>175μ$.

All these values are imposed by the value of the nominal width of conductor 77 (L=125μ). It is recalled that the reject criteria are computed from $L_{min}$, but it would be also possible to compute said criteria from L. By making the reject criteria more selective, the reliability of the inspection process of this invention is improved.

Figure 22:
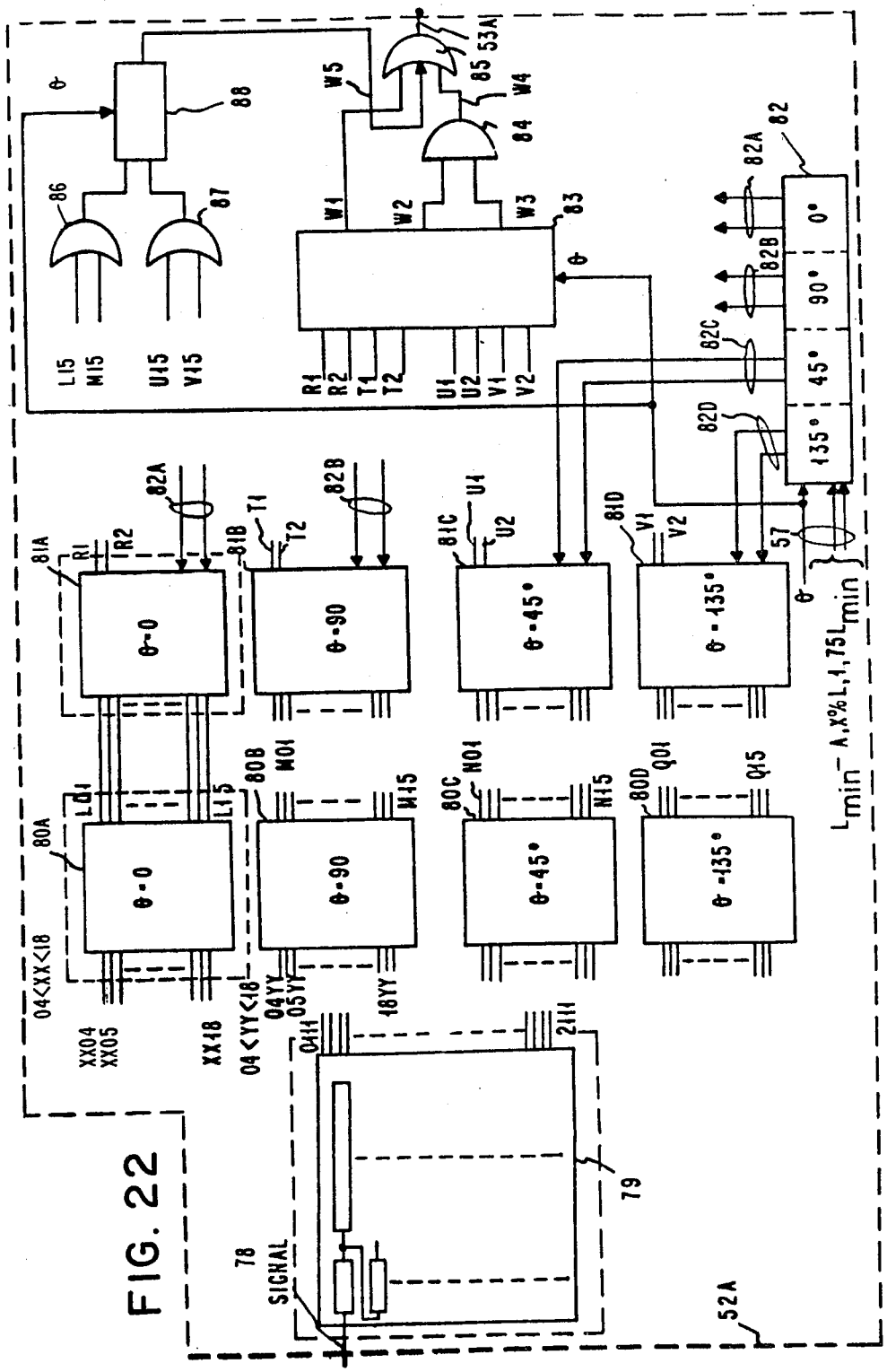
FIG. 22 schematically shows the defect analysis block which, on the one hand, computes the defect projections in two directions (the direction of the conductor showing this defect and the perpendicular direction) and, on the other hand, compares said projections with the reject criteria established for the location of this defect, in order to determine whether the object is to be accepted or rejected.

FIG. 22 schematically shows the various circuits composing block 52A provided for analysing the defects with respect to the reject criteria. It has two main functions: computing the defect projections along directions $\theta$ and $\theta+90°$, and comparing said projections with the reject criteria corresponding to the maximum allowed size of the defect.

Figure 23:
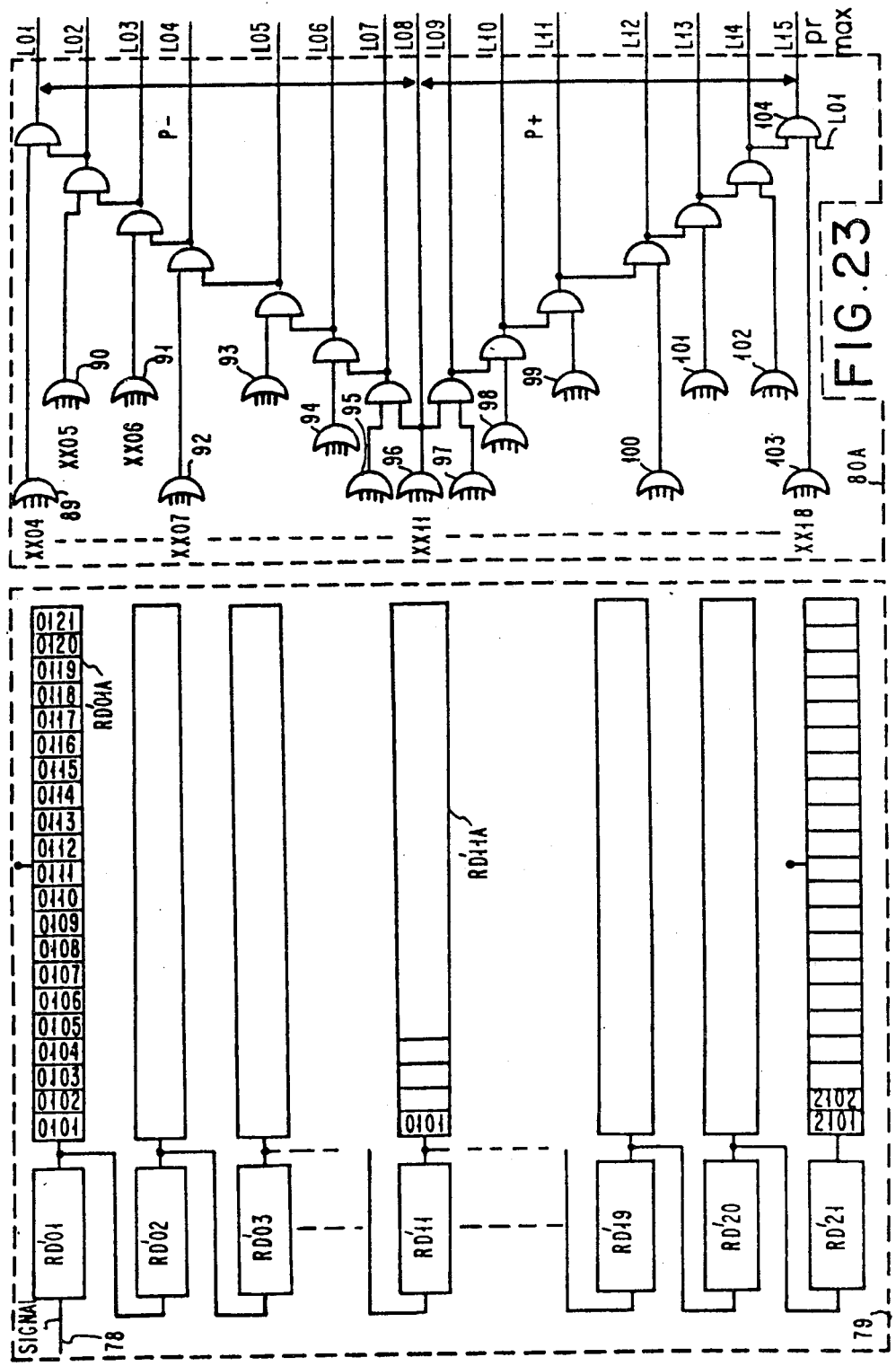
FIG. 23 is a detailed illustration of the circuit computing the defect projection in one direction ($\theta = 0$) and, FIG. 24 shows the circuit comparing this defect projection with the reject criteria.
Figure 24:
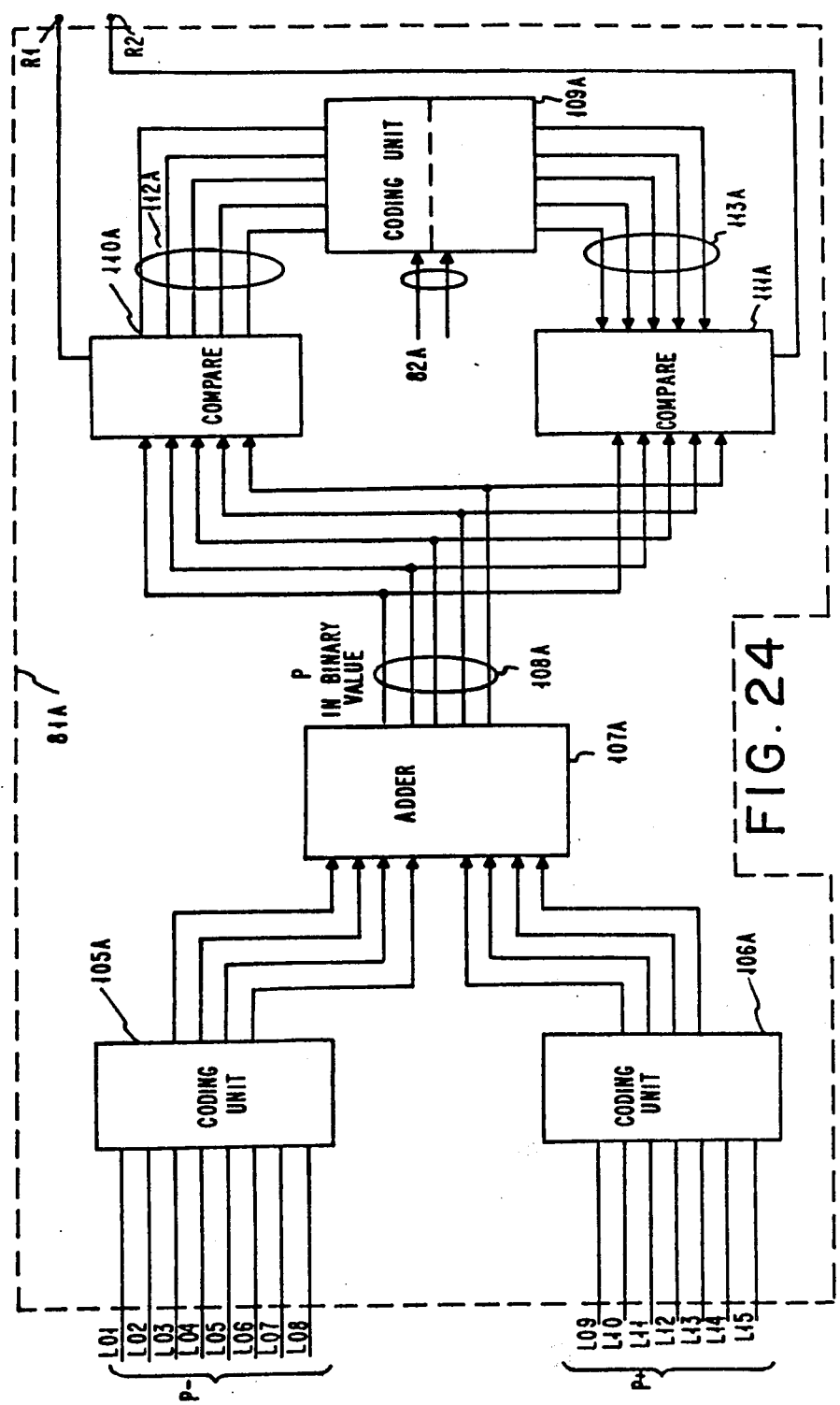

Therefore, signal 78 applied to block 52A is the signal representative of the image of the "lack" type defect. A first circuit 79 more particularly comprised if shift registers with parallel outputs allows at any time, the operator to access to the contents (0 or 1) of the cells of these registers corresponding to the desired pixels of window 75 identified by their coordinates. Circuit 79 is shown in details on FIG. 23. All the pixels (in binary form) of the analysis window, therefore corresponding to the positions given by coordinates 0111 to 2111, are available at the output of circuit 79. Block 80 computes the defect length or more particularly, the projections of the defect along the four directions. For instance, circuit 80A computes the defect projection along 0°. At the output of this circuit, the binary value displayed on lines L01 to L15 is representative of the length of the defect. Circuit 80A is described in detail on FIG. 23. It is recalled that the reject criteria include two terms ($L_{min}-A$ and $X\% \ L_{min}$) for the vertical projection and a term ($k \ L_{min}$) for the horizontal projection of the defect (see FIG. 21). Therefore, after having decoded the two directions (for instance 0° and 90°) which are considered, the function of circuits 81 consists in checking that the dimensions of the defect along these directions, are acceptable. Circuits 81 are controlled from a demultiplexer 82 receiving its information from memory 45 through bus 57, according to a truth table to be described in the following. Therefore, each circuit 81 is provided with two outputs. FIG. 24 is a detailed illustration of circuit 81A. The information available on the two lines of each circuit 81 indicates whether the projection of the defect along the direction considered, can be accepted or not. This information is transmitted to a multiplexer 83 which, according to the value of $\theta$, selects among the eight possible pairs, two pairs corresponding to the direction of the conductor and its perpendicular direction since the reject criteria contain three terms, it should be understood that only three values (one horizontal projection and two vertical projections) are useful. Three values appear at the output of multiplexer 83 on three lines W1, W2 and W3.

AND circuit 84 checks that if the vertical projection of the defect exceeds $X\% \ L_{min}$ and if its horizontal projection exceeds $k \ L_{min}$, the defect imples a rejection (W4 at level 1). Line W1 is high (W1 at level 1) when the vertical projection exceeds $L_{min}-A$. Lines W1, W4 and W5 are connected to an OR circuit 85 if only one of these three lines is high, line 53A is high, the defect is inacceptable and the module is rejected. Line W5 is issued from lines L15, M15, U15 and V15 which, as seen below, are high as soon as at least one of the two projections along the directions considered, exceeds the dimension of the analysis window (15 pixels). OR circuit 86 receives lines L15 and M15. OR circuit 87 receives U15 and V15. And multiplexer 88 controlled by conductor direction $\theta$ selects the appropriate pair of lines. It will be easier to understand the operation of block 52A by using the detailed description of the circuits which are shown on FIGS. 23 and 24. FIG. 23 shows block 79 which is used to memorize the analysis window. This block includes 21 shift registers of 2048 bits referenced RD01 to RD21, since analysis window 75 covers 21 lines (between pixels 0111 and 2111). These shift registers are fed in cascade. Each register as RD01 is connected to a 21-bits shift register RD01A corresponding to the 21 columns of the analysis window. This register is provided with parallel outputs, i.e. the contents of each cell can be accessed. It contains all the pixels in position 01YY, YY varying from 01 to 21, i.e. all the pixels of the first line, however, only pixel 0111 is useful to constitute the analysis window (see FIG. 20). One proceeds in the same way for all the other registers. For instance, register RD11A contains all the pixels of the eleventh line, i.e. pixels 1101 to 1121. All these pixels are used at least one time to constitute the analysis window.

Defect 76 of FIGS. 20 and 21 is characterized in that the pixels in positions 1011, 1110, 1111, 1112 and 1113 are provided with a binary 1 value.

Circuits 80 are provided to compute the defect lengths.

Circuit 80A and 80B respectively compute the defect dimensions along directions 0° and 90°, i.e., the horizontal and vertical projections of defect 76 chosen as an example. As soon as defect 76 is entirely within the analysis window, the exact values of its projections are available on lines L01 to L15. Circuit 80A comprises a series of 15 OR circuits 89 to 103 provided with 15 inputs. OR circuit 89 corresponds to all the pixels of the first column of analysis window 75 along direction 0°, i.e. the pixels in position XX01, XX varying from 04 to 18, and so on for all the OR circuits, OR circuit 103 summing the pixels of the fifteenth column, i.e. pixels XX18, XX varying from 04 to 18. As to the wiring, it is to be understood that the inputs of OR circuit 89 are connected to the output of the cells bearing the corresponding numbers. For instance, first input 0404 is connected to the output of the fourth cell of RD04. One proceeds in the same way for all the OR gates of 80A. The construction of circuits 80B, 80C and 80D can be easily deduced from the above characteristics. The outputs of the OR gates are connected to AND gates as shown on FIG. 23. The output of the AND gates are referenced L01 to L15. The condition of these outputs indicates the length of the defect along the direction which is considered, with respect to central line L08 which is representative of the central pixel which is analysed. In this example, when analysis window 75 is centered on pixel 1111 of defect 76, only four OR gates have an output equal to 1. These gates are gates 95, 96, 97 and 98 which correspond to the 7, 8, 9 and 10$^{th}$ columns of the window for which there is at least one pixel with a binary 1 value. Therefore, a 1 will be found only on lines L07, L08, L09 and L10. This means that the defect has a horizontal projection of four steps of 12.5$\mu$ i.e. 50$\mu$ which can be decomposed into P$^-$=25$\mu$ and P$^+$=25$\mu$ on both sides of the central pixel under inspection (see FIG. 21). Line L08 is at level 1 as soon as the central pixel under inspection is a pixel corresponding to a defect. The number of lines which are high on both sides of line L08 allows an immediate determination of the defect projection (in a multiple of 12.5$\mu$) to be carried out. Breaking the defect applies zeroes on all the lines from the time at which breaking occurs. For instance, defect 76 does not extend up to the sixth column. OR gate 94 which corresponds to the pixels of the column receives only zeroes on its inputs and therefore applies a zero to the AND gate next to it. The "0" is transmitted in cascade on all the AND gates so that lines L06 to L01 are low (0).

AND gate 104 ensures a particular function. Line L01 is also applied to AND gate 104. In other words, L15 is at level 1 when the defect exceeds or is equal to the dimension of the analysis window (15 pixels). In this case, line L15 indicates that the defect projection is greater than the analysis window and the module is to be rejected.

Circuits 80B, 80C and 80D operate in the same way and their outputs are respectively referenced M01 to M15, N01 to N15 and Q01 to Q15.

Circuits 80B, 80C and 80D operate in the same way and their outputs are respectively referenced M01 to M15, N01 to N15 and Q01 to Q15.

Circuits 80A to 80D operate permanently and the projections along the four directions are available at any time. For instance, when the analysis window is centered on central pixel 1111, circuit 80A measuring the horizontal projection (along direction 0°) of defect 76 provides a value of 50$\mu$. Circuit 80B measuring the vertical projection (along direction 90°) provides a value of 25$\mu$. The defect projections along 45° and 135° are respectively available on lines N01 to N15 and Q01 to Q15, but are not interesting in this case, since direction $\theta$ of conductor 77 is along 0°.

Then, the projections are quantized through coding units 105A and 106A. Therefore, the output delivers the binary value corresponding to the value of the projection. The coding units can be EPROM memories of the MM2708 type.

Projections P$^-$ and P$^+$ are applied to the "address" inputs and the binary value is available on the "data" outputs.

The transfer function of coding units 105A and 106A is as follows:

| Lines L | 01 | 02 | 03 | 04 | 05 | 06 | 07 | 08 | data |
|---|---|---|---|---|---|---|---|---|---|
|  | 15 | 14 | 13 | 12 | 11 | 10 | 09 | 08 |  |
|  | 0 | 0 | 0 | 0 | 0 | 0 | 0 | 0 | 0000 |
|  | 0 | 0 | 0 | 0 | 0 | 0 | 0 | 1 | 0001 |
|  | 0 | 0 | 0 | 0 | 0 | 0 | 1 | 1 | 0010 |
|  | 0 | 0 | 0 | 0 | 0 | 1 | 1 | 1 | 0011 |
|  | 0 | 0 | 0 | 0 | 1 | 1 | 1 | 1 | 0100 |
|  | 0 | 0 | 0 | 1 | 1 | 1 | 1 | 1 | 0101 |
|  | 0 | 0 | 1 | 1 | 1 | 1 | 1 | 1 | 0110 |
|  | 0 | 1 | 1 | 1 | 1 | 1 | 1 | 1 | 0111 |
|  | 1 | 1 | 1 | 1 | 1 | 1 | 1 | 1 | 1000 |

As previously said, the central pixel is a part of P$^-$. The maximum value of P$^+$ is of 0111 while the maximum value of P$^-$ is of 1000.

The binary value of total projection P=P$^-$+P$^+$ is computed by binary adder 107A and it is available on bus 108A.

The horizontal projection of defect 76 is such that P$^-$=25$\mu$ and P$^+$=25$\mu$, or such that L07=L08=L09=L10=1, all the other lines being at 0.

First coding unit 105A which corresponds to P$^-$ provides a binary 0010 value while coding unit 106A which corresponds to P$^+$ also provided a binary 0010 value. At the output of adder 107A, the horizontal projection of defect 76 is shown by the binary 0010+00010=0100 value.

At the adder output, the binary 0000 value indicates that there is no defect. The binary 0001 value indicates that there is a defect limited to one pixel. The binary 1111 value corresponds to a defect of maximum size P$^-$+P$^+$=15 steps of 12.5$\mu$=187.5$\mu$ which exceeds the value of 175$\mu$ which is one of the reject criteria.

It was seen above that with the reject criteria which have been chosen (in particular, see FIG. 21 which shows the reject criteria relating to defect 76 of conductor 77), there are a maximum of two thresholds to be analysed for each projection. In the particular case of FIG. 21, it is necessary to check that the vertical projection of defect 76 (equal to 25$\mu$ is lower than or equal to X% L$_{min}$=0.25.100$\mu$=25$\mu$ on the one hand and to L$_{min}$−A=100−25$\mu$=75$\mu$, on the other hand. It is recalled that a defect with a projection exceeding 0.25 L can be, nevertheless, accepted provided that its perpendicular projection is lower than 1.75 L$_{min}$.

Thus, there are a maximum of two thresholds to be analysed. For instance, in the example which has been chosen, circuit 81A which analyses the horizontal projection should compare it to threshold k L$_{min}$=1.75$\mu$, while circuit 81B which analyses the vertical projection should compare said vertical projection with thresholds X% L$_{min}$=25$\mu$ and L$_{min}$−A=75$\mu$. In the first case, the data are provided from bus 82A (elaborated in demultiplexer 82), to dual coding circuit 109A which displays the reject criterion in binary form on two compare units 110A and 111A. For instance, for circuit 81A, the coding unit displays 1.75 L$_{min}$=175$\mu$ (binary 1110 value) on compare unit 110 through bus 111A. Further, this compare unit receives horizontal projection P of defect 76, i.e. 50$\mu$ (binary 1000 value), projection P being lower than the reject criterion, (acceptable defect), output R1 of the adder is at a low level (0). If projection P exceeds the value defined by the reject criterion (unacceptable defect), output R1 has a binary 1 value. In the case of circuit 81A, there is a single reject criterion. Then, coding unit 109A displays 1111 on compare unit 111A through bus 113A which also receives projection P (1000) on its other inputs. Therefore, output R2 is at a "0" level.

Therefore, circuit 81B which analyses the vertical projection of defect 76, is provided with two reject criteria: $L_{min}-A=75\mu$ and $X\% L=25\mu$. These values are displayed on coding unit 109B in binary form from bus 82B so that compare unit 110B performs a comparison between the defect vertical projection $P=25\mu$ and $X\% L_{min}=25\mu$ and, in the same way compare unit 111B performs a comparison between $P=25\mu$ and $L_{min}-A75\mu$. Defect 76 is being acceptable after these comparisons, outputs T1 (which corresponds to criterion $X\% L_{min}$) and T2 (which corresponds responds to criterion $L_{min})-A$) are also at the 0 level.

Respective outputs U1, U2 and V1, V2 of circuits 81C and 81D which correspond to projections along directions not taken into consideration, are forced to the 0 level from bus controls 82C and 82D issued from demultiplexer 82. Anyway, these outputs are not taken into consideration (in the case of defect 76) by multiplier 83, as explained in the following: This demultiplexer is shown on FIG. 22. It is controlled from bus 57 which contains data $\theta$, $L_{min}-A$, $X\% L_{min}$, $k L_{min}$. According to the value of $\theta$, the reject criteria are applied to the appropriate circuits in accordance with the following transfer table:

| $\theta$ in degrees | $\theta$ in binary value | Criteria displayed on the buses | | | | | | | |
|---|---|---|---|---|---|---|---|---|---|
| | | 82A | | 82B | | 82C | | 82D | |
| | | R1 | R2 | T1 | T2 | U1 | U2 | V1 | V2 |
| 0° | 00 | $kL_{min}$ | | $X\% L_{min}$ | $L_{min}-A$ | | | | |
| 90° | 01 | $X\% L_{min}$ | $L_{min}-A$ | $kL_{min}$ | | | | | |
| 45° | 11 | | | | | $kL_{min}$ | | $X\% L_{min}$ | $L_{min}-A$ |
| 135° | 11 | | | | | $X\% L_{min}$ | $L_{min}-A$ | $kL_{min}$ | |

It is recalled that defect 76 is located within a square for which $L_{min}=100\mu$, $A=25\mu$, $X=0.25$ and $k=1.75$ (see FIG. 21). All outputs R1, R2, T1, T2, U1, U2, V1, V2 are connected to a multiplexer 83 which, according to the value of angle $\theta$ applied thereto, selects the appropriate outputs in accordance with the following table showing the correspondances:

| $\theta$ | W1 | W2 | W3 |
|---|---|---|---|
| 0 | T2 | T1 | R1 |
| 90 | R2 | R1 | T1 |
| 45 | V2 | V1 | U1 |
| 135 | U2 | U1 | V1 |

For instance, for defect 76, one has $\theta=0°$. R1 corresponds to the comparison with reject criterion 1.75 $L_{min}$, while T1 and T2 correspond to reject criteria 0.25 $L_{min}$ and $L_{min}-25$. It has been seen that defect 76 is acceptable. Therefore, R1=0, T1=0, T2=0. Lines W1, W2, W3 are at a low level. Output W4 of gate 84 is at a low level as well as line W1. If output W5 is also at a low level, the OR gate displays a "0" at its output on line 53A. One considers that the defect measured from the pixel under analysis is acceptable.

To consider a defect as unacceptable, it is sufficient to have line W1 at the 1 level (this means that the vertical projection of the defect exceeds reject criterion $L_{min}-A$) or line 14 at the 1 level (this means that the vertical projection of the defect exceeds k $L_{min}$ and that its horizontal projection exceeds $KL_{min}$) or, at last, W5 at the 1 level. Line W5 results, through multiplexer 88, from lines L15, M15, N15 and Q15 which are at a high level as soon as the defect reaches the size of the analysis window in the direction considered. The multiplexer selects the useful pair in accordance with the value of $\theta$. For instance, in the case of defect 76, if $\theta=0°$, it selects the output of OR gate 86. If L15 (or M15) is high, this means that the horizontal (or vertical) projection reaches at least 15 pixels and such a defect must cause the module to be rejected.

The structure and operation of defect analysis block 52B are identical to the ones of block 52A. Only the reject criteria contained in data table No. 2 correspond, as seen above, to the conductor interspace and to direction $\theta'$ of this interspace.

Lines 53A and 53B are connected to an OR gate which collects the information issued from defect analysis blocks 52A and 52B. The final information is processed by the computer.

While there have been described what are at present considered to be a preferred embodiment of this invention, it will be obvious to those skilled in the art that various changes and modifications may be made therein without departing from the invention, and it is, therefore, intended to cover all such changes and modifications as fall within the true spirit and scope of the invention.

Having thus described my invention, what I claim as new, and desire to secure by Letters Patent is:

1. A process for inspecting objects showing patterns with dimensional tolerances and reject criteria varying in accordance with the location of said patterns, of the type including the comparision of image $I_{ref}$ of a reference object with image $I_{exa}$ of an object to be inspected, the latter being liable to show geometrical defects with respect to the reference object, characterized in that in includes the following steps;

Step 1—elaborating binary electronic images $I_{REF}$ and $I_{EXA}$ from images $I_{ref}$ and $I_{exa}$, Step 2—defining a structuring element B for each image point (pixel) the size of said structuring element being able to vary for each pixel in function of predetermined data and adjusting $I_{REF}$ to the maximum and minimum dimensional tolerances by expanding and eroding said image by structuring element B, which provides $(I_{REF})_{max}$ and $(I_{REF})_{min}$, Step 3—forming images of the "spreading" and "lack" type defects by respectively carrying out the following logical operations:

[(I$_{REF}$)$_{max}$ OR I$_{EXA}$] EXCL. OR (I$_{REF}$)$_{max}$ and

[(I$_{REF}$)$_{min}$ OR I$_{EXA}$] EXCL. OR I$_{EXA'}$ and

Step 4—measuring the size of the defects on the defect images and comparing said defects with respect to reject criteria which define, for each pixel, the dimensions of the defects which can be accepted according to predetermined data.

2. A process as set forth in claim 1 characterized in that the step 1 provided for elaborating images I$_{REF}$ and I$_{EXA}$ includes the following operations:
picking-up images I$_{ref}$ and I$_{exa}$ of the reference object and of the object to be inspected in analog form, in black and white, with all the grey levels,
sampling images according to a determined frame chosen in the group including the hexagonal frame, the square frame, . . . ,
quantizing the image to retain only a number $2^N$ of grey levels with $2 \leq N \leq 6$, and
thresholding the images to obtain said electronic binary images.

3. A process as set forth in claim 2 characterized in that the thresholding operation includes the determination of the threshold of images I$_{ref}$ and I$_{exa}$, which is carried out from the frequency curve of the pixel intensities.

4. A process as set forth in claim 3 characterized in that the threshold determination is program controlled.

5. A process as set forth in claim 4 characterized in that it further includes a step for centering electronic images I$_{REF}$ and I$_{EXA}$, said step corresponding to the optical centering of images I$_{ref}$ and I$_{exa}$.

6. A process as set forth in claim 1 characterized in that the step 1 provided for elaborating binary electronic images I$_{REF}$ and I$_{EXA}$ includes the following operations:
picking-up image I$_{exa}$ of the object to be inspected in analog form, in black and white, with all the grey levels,
sampling this image according to a determined frame chosen in the group including: the hexagonal frame, the square frame, . . . ,
quantizing the image to retain only a number $2^N$ of grey levels with $2 \leq N \leq 6$,
thresholding the image to obtain I$_{EXA}$ and
elaborating directly I$_{REF}$ either from a digital pattern generator or from a data bank.

7. A process as set forth in claim 1 characterized in that it further includes a step for cleaning images I$_{REF}$ and I$_{EXA}$ (noise suppression) carried out prior to the dimensional tolerance adjustment step and consisting either in an opening operation, or in a closing operation, or in a combination of both, the size of the erosion being lower than the size of the smallest defect to be detected.

8. A process as set forth in claim 1 characterized in that the structuring element of step 2 has the approximate shape of a circle with a variable diameter.

9. A process as set forth in claim 8 characterized in that the structuring element of step 2 is comprised of a plurality of concentric rings which are developed from the central pixel which is the pixel under analysis, these rings being separated one from the others by an interval equal to the interval separating two pixels.

10. A process as set forth in claim 1 characterized in that the size of each defect in step 4 is determined by computing the horizontal and vertical projections along at least, a pair of axes perpendicular along directions $\theta$ and $\theta + 90°$.

11. A process as set forth in claim 10 characterized in that direction $\theta$ corresponds to the direction of the pattern which contains the defect.

12. A process as set forth in claim 11 characterized in that reject criteria are deduced from the dimensions and direction of the pattern and appear as terms which can be compared with said projections.

13. A process as set forth in claim 12 characterized in that the reject criteria, the dimensional tolerance and direction $\theta$ are common to all the pixels of a same region.

14. A process as set forth in claim 13 characterized in that the reject criteria, the dimensional tolerance and direction $\theta$ are automatically generated for each region by a computer after scanning of I$_{REF}$ along the possible directions of the configuration patterns through the use of a program.

15. A process as set forth in claim 1 characterized in that said predetermined data of step 4 are provided in two data tables No. 1 and No. 2, respectively; for the defects of the "lack" type and of the "spreading" type.

16. A process as set forth in claim 15 characterized in that, for each pixel, the corresponding data include dimensional tolerances N, pattern direction $\theta$ and the reject criteria which define one or several analysis windows.

17. An apparatus for inspecting objects showing patterns with dimensional tolerances and reject criteria varying with the location of said patterns, of the type comparing image I$_{ref}$ of a reference object with image I$_{exa}$ of an object to be inspected liable to show geometrical defects with respect to the reference object, characterized in that it includes:
means for picking-up at least I$_{exa}$,
means for elaborating binary electronic images I$_{REF}$ and I$_{EXA}$,
processing means including means for adjusting I$_{REF}$ by expanding and eroding it to the maximum and minimum tolerances, by a structuring element B the size of which can vary for each pixel, in function of predetermined data, compare means for forming images of the defects of the "spreading" and "lack" types by respectively carrying out the following logic operations:

[(I$_{REF}$)$_{max}$ OR I$_{EXA}$] EXCL. OR (I$_{REF}$)$_{max}$ and

[(I$_{REF}$)$_{min}$ OR I$_{EXA}$] EXCL. OR I$_{EXA}$, and means for analysing defects, including means for measuring the size of the defects and means for comparing said defects with reject criteria defining for each pixel, the defect dimensions which can be accepted, in accordance with predetermined data.

18. An apparatus as set forth in claim 17 further characterized in that it includes:
synchronizing and addressing means which, for each pixel which is analysed, fetch said predetermined data out of a memory into which they have been previously charged.

19. An apparatus as set forth in claim 18 characterized in that the picking-up means are chosen from the group including the electron microscopes, the TV cameras, the photodiodes arrays and the coupled charge devices.

20. An apparatus as set forth in claim 18 characterized in that said means for elaborating electronic images $I_{REF}$ and $I_{EXA}$ include a unit for detecting a threshold and for thresholding at least $I_{EXA}$.

21. An apparatus as set forth in claim 18 characterized in that $I_{REF}$ is stored in a buffer memory.

22. An apparatus as set forth in claim 18 characterized in that it further includes computing means for recentering electronic images $I_{REF}$ and $I_{EXA}$.

23. A circuit for adjusting an electronic reference signal $I_{REF}$ to minimum dimensional tolerances by using a structural element of circular shape and variable size, formed of a plurality of concentric rings characterized in that it includes:
- means for storing all the pixels of $I_{REF}$ constituting said structuring element, into memory cells,
- a plurality of AND gates respectively forming each of said rings, the inputs of each AND gate being constituted by the contents of the cells corresponding to the constitutive pixels of the ring under consideration,
- decoding means for selecting the number and rank of the rings to be considered, and
- an AND gate for integrating said selected rings so that signal $(I_{REF})_{min}$ is obtained at the output of said gate.

24. A circuit as set forth in claim 23, characterized in that:
- said storing means include on the one hand, n shift registers, the cell number of which corresponds to the pixel number of each line of $I_{REF}$, and n corresponds to the line number of the structuring element, and on the other hand, n shift registers comprised of cells with parallel outputs, the number of cells corresponding to the number of columns of the structuring element.

25. A circuit for adjusting an electronic reference signal $I_{REF}$ to maximum dimensional tolerances by using a structuring element of circular shape and variable size, comprised of a plurality of concentric rings, characterized in that it includes:
- means for storing all the pixels of ($I_{REF}$) constituting said structuring element into memory cells,
- a plurality of AND gates respectively constituting each of said rings, the inputs of each AND gate constituted by the contents of the cells corresponding to the constitutive pixels of the ring under consideration,
- decoding means for selecting the number and rank of the rings to be considered, and
- an AND gate (69) followed by an invert circuit (71) for integrating said selected rings so that signal $(I_{REF})_{max}$ is obtained at the output of this gate.

* * * * *